US010255986B2

United States Patent
Chinnakkonda Vidyapoornachary et al.

(10) Patent No.: US 10,255,986 B2
(45) Date of Patent: *Apr. 9, 2019

(54) ASSESSING IN-FIELD RELIABILITY OF COMPUTER MEMORIES

(71) Applicant: International Business Machines Corporation, Armonk, NY (US)

(72) Inventors: Diyanesh B. Chinnakkonda Vidyapoornachary, Bangalore (IN); Kyu-hyoun Kim, Chappaqua, NY (US); Anil B. Lingambudi, Bangalore (IN); Adam J. McPadden, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/617,158

(22) Filed: Jun. 8, 2017

(65) Prior Publication Data

US 2018/0358107 A1     Dec. 13, 2018

(51) Int. Cl.
    *G06F 11/00*     (2006.01)
    *G11C 29/10*     (2006.01)
    (Continued)

(52) U.S. Cl.
    CPC .......... *G11C 29/10* (2013.01); *G06F 11/1016* (2013.01); *G11C 29/42* (2013.01); *G11C 2029/1204* (2013.01)

(58) Field of Classification Search
None
See application file for complete search history.

(56) References Cited

U.S. PATENT DOCUMENTS 5,235,550 A    8/1993   Zagar
6,138,249 A    10/2000   Nolet
(Continued)

FOREIGN PATENT DOCUMENTS

EP     2939239 A1     11/2015

OTHER PUBLICATIONS

Chinnakkonda Vidyapoornachary et al., "Assessing In-Field Reliability of Computer Memories," U.S. Appl. No. 15/900,917, filed Feb. 21, 2018.

(Continued)

*Primary Examiner* — Mujtaba M Chaudry
(74) *Attorney, Agent, or Firm* — Peter Edwards

(57) ABSTRACT

The present invention provides a computer implemented method, system, and computer program product of assessing in-field reliability of computer memories. In an embodiment, the present invention includes taking control of a portion of a computer memory circuit, utilizing a portion of a computer memory bus associated with the portion of the computer memory circuit, moving computer memory circuit data stored in the portion of the computer memory circuit to a host computer storage device, executing a set of logical operations assessing reliability of the portion of the computer memory circuit, resulting in assessment data stored in a reliability error monitor (REM) computer storage device, transmitting the stored assessment data from the REM computer storage device to a computer memory controller circuit, and in response to the transmitting, moving the moved computer memory circuit data from the host computer storage device back to the portion of the computer memory circuit.

20 Claims, 9 Drawing Sheets

(51) Int. Cl.
*G06F 11/10* (2006.01)
*G11C 29/42* (2006.01)
*G11C 29/12* (2006.01)

(56) References Cited

U.S. PATENT DOCUMENTS

| | | | | |
|---|---|---|---|---|
| 6,324,088 | B1* | 11/2001 | Keeth | G11C 5/025 |
| | | | | 365/51 |
| 7,409,669 | B1* | 8/2008 | Dastidar | G01R 31/318516 |
| | | | | 716/117 |
| 8,930,776 | B2 | 1/2015 | Cordero et al. | |
| 9,086,957 | B2* | 7/2015 | Cordero | G06F 11/2221 |
| 9,317,366 | B2 | 4/2016 | Wang | |
| 9,432,298 | B1* | 8/2016 | Smith | H04L 49/9057 |
| 2002/0078403 | A1 | 6/2002 | Gullo et al. | |
| 2004/0257090 | A1* | 12/2004 | Barr | G01R 31/046 |
| | | | | 324/537 |
| 2006/0253749 | A1 | 11/2006 | Alderegula et al. | |
| 2010/0060310 | A1* | 3/2010 | Laisne | H01L 25/0657 |
| | | | | 326/10 |
| 2013/0124787 | A1* | 5/2013 | Schuette | G06F 12/0246 |
| | | | | 711/103 |
| 2014/0192583 | A1* | 7/2014 | Rajan | G11C 7/10 |
| | | | | 365/63 |
| 2014/0245105 | A1* | 8/2014 | Chung | G06F 11/1048 |
| | | | | 714/763 |
| 2016/0042809 | A1* | 2/2016 | Kim | G11C 29/42 |
| | | | | 714/719 |
| 2016/0224412 | A1 | 8/2016 | Healy et al. | |
| 2016/0378591 | A1* | 12/2016 | Naeimi | G11C 29/52 |
| | | | | 714/764 |

OTHER PUBLICATIONS

List of IBM Patents or Patent Applications Treated as Related, Dated Feb. 20, 2018, 2 pages.

"Accelerated Examination Support Document," International Business Machines Corporation, Dated Feb. 20, 2018, 31 pages.

Khan, et al., "The Efficacy of Error Mitigation Techniques for DRAM Retention Failures: A Comparative Experimental Study," SIGMETRICS'14, Jun. 16-20, 2014, Austin, Texas, Copyright 2014 ACM, 14 pages https://users.ece.cmu.edu/~omutlu/pub/error-mitigation-for-intermittent-dram-failures_sigmetrics14.pdf.

Khan, et al., "Solving the DRAM Scaling Challenge: Rethinking the Interface Between Circuits, Architecture, and Systems," printed on Mar. 8, 2017, 85 pages https://www.ece.cmu.edu/~safari/thesis/skhan_jobtalk_slides.pdf.

Lee, et al., Reducing DRAM Latency by Exploiting Design-Induced Latency Variation in Modern DRAM Chips, printed on Mar. 8, 2017, 18 pages, https://arxiv.org/pdf/1610.09604.pdf.

* cited by examiner

ASSESSING IN-FIELD RELIABILITY OF COMPUTER MEMORIES

BACKGROUND

The present disclosure relates to computer memories, and more specifically, to assessing in-field reliability of computer memories.

SUMMARY

The present invention provides a computer implemented method, a system, and a computer program product of assessing in-field reliability of computer memories. In an exemplary embodiment, the computer implemented method, the system, and the computer program product include (1) taking control, by a host computer system, of a portion of a computer memory circuit, (2) utilizing, by the host computer system, a portion of a computer memory bus, where the portion of the computer memory bus is associated with the portion of the computer memory circuit, (3) moving, by the host computer system, computer memory circuit data stored in the portion of the computer memory circuit to a host computer storage device, (4) executing, by the host computer system, a set of logical operations assessing reliability of the portion of the computer memory circuit, resulting in assessment data stored in a reliability error monitor (REM) computer storage device, (5) transmitting, by the host computer system, the stored assessment data from the REM computer storage device to a computer memory controller circuit, and (6) in response to the transmitting, moving, by the host computer system, the moved computer memory circuit data from the host computer storage device back to the portion of the computer memory circuit.

DETAILED DESCRIPTION

Figure 1A:
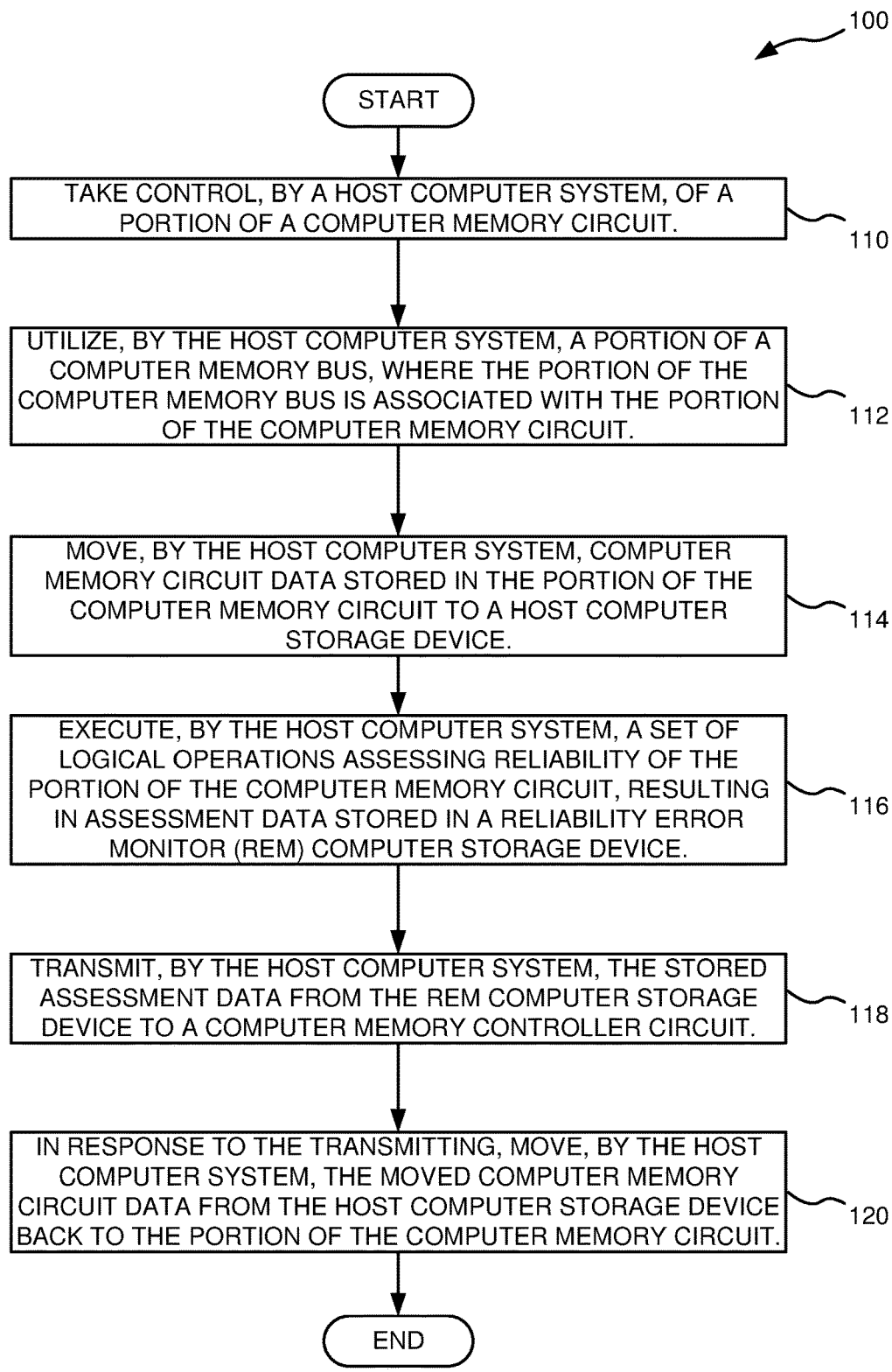
FIG. 1A depicts a flowchart in accordance with an exemplary embodiment of the present invention.

The present invention provides a computer implemented method, a system, and a computer program product of assessing in-field reliability of computer memories. In an exemplary embodiment, the computer implemented method, the system, and the computer program product include (1) taking control, by a host computer system, of a portion of a computer memory circuit, (2) utilizing, by the host computer system, a portion of a computer memory bus, where the portion of the computer memory bus is associated with the portion of the computer memory circuit, (3) moving, by the host computer system, computer memory circuit data stored in the portion of the computer memory circuit to a host computer storage device, (4) executing, by the host computer system, a set of logical operations assessing reliability of the portion of the computer memory circuit, resulting in assessment data stored in a reliability error monitor (REM) computer storage device, (5) transmitting, by the host computer system, the stored assessment data from the REM computer storage device to a computer memory controller circuit, and (6) in response to the transmitting, moving, by the host computer system, the moved computer memory circuit data from the host computer storage device back to the portion of the computer memory circuit. In a particular embodiment, the host computer system includes the computer memory controller circuit. In a specific embodiment, the host computer system is the computer memory controller circuit. In a particular embodiment, the portion of the computer memory circuit includes a set of memory cells of the computer memory circuit. In a specific embodiment, the portion of the computer memory circuit is a set of memory cells of the computer memory circuit. In a particular embodiment, the set of memory cells includes at least one of an area of a memory array, a memory bank, a memory rank, and an area of a dual in-line memory module (DIMM) module. In a specific embodiment, the set of memory cells is at least one of an area of a memory array, a memory bank, a memory rank, and an area of a DIMM.

In an exemplary embodiment, the computer implemented method, the system, and the computer program product include (1) taking control, by a computer memory controller circuit, of a portion of a computer memory circuit, (2) utilizing, by the computer memory controller circuit, a portion of a computer memory bus, where the portion of the computer memory bus is associated with the portion of the computer memory circuit, (3) moving, by the computer memory controller circuit, computer memory circuit data stored in the portion of the computer memory circuit to a host computer storage device, (4) executing, by the computer memory controller circuit, a set of logical operations assessing reliability of the portion of the computer memory circuit, resulting in assessment data stored in a reliability error monitor (REM) computer storage device, and (5) in response to the executing, moving, by the computer memory controller circuit, the moved computer memory circuit data from the host computer storage device back to the portion of the computer memory circuit. In a particular embodiment, the computer memory controller circuit includes a computer memory controller. In a specific embodiment, the computer memory controller circuit is a computer memory controller.

Definitions

Computer Memory

A computer memory/computer memory is a computer hardware device that stores information/data for immediate use in a computer/computer system and is also called "primary storage". Computer memory operates at a high speed (e.g., random-access memory (RAM)), as opposed to storage that provides slow-to-access program and data storage but offers higher capacities (i.e., secondary storage) (e.g., computer hard disk drives). If needed, contents of the computer memory could be transferred to secondary storage, through a memory management technique called "virtual memory". Computer memory (i.e., primary storage) (i.e., main memory) is often associated with addressable semiconductor memory (i.e., integrated circuits consisting of silicon-based transistors) used as primary storage but also used for other purposes in computers and other digital electronic devices. The two main kinds of semiconductor memory are volatile memory (e.g., primary storage (typically dynamic random-access memory (DRAM), fast central processing unit (CPU) cache memory (typically static random-access memory (SRAM) that is fast but energy-consuming, offering lower memory areal density than dynamic random-access memory (DRAM))) and non-volatile memory (e.g., flash memory (used as secondary memory), read-only memory (ROM) (e.g., programmable read-only memory (PROM), erasable programmable read-only memory (EPROM), electrically erasable programmable read-only memory (EEPROM) (used for storing firmware such as BIOS)).

Most semiconductor memory is organized into memory cells or bistable flip-flops, each storing one bit, a logical zero (0) value or a logical one (1) value. Flash memory organization includes both one bit per memory cell and multiple bits per cell (called multiple level cell (MLC)). The memory cells are grouped into words of fixed word length (e.g., 1, 2, 4, 8, 16, 32, 64, or 128 bit), where each word can be accessed by a binary address of N bit, making it possible to store $2^N$ words in the memory. Thus, processor registers normally are not considered as memory, since they only store one word and do not include an addressing mechanism.

Memory Management

Proper management of memory is vital for a computer system to operate properly. Modern operating systems have complex systems to properly manage memory. Failure to do so could lead to bugs, slow performance, and at worst case, takeover by viruses and malicious software. Protected memory is a system where each program is given an area of memory to use and is not permitted to go outside that range. Use of protected memory greatly enhances both the reliability and security of a computer system. Without protected memory, it is possible that a bug in one program will alter the memory used by another program. This will cause that other program to run off corrupted memory with unpredictable results. If the operating system's memory were corrupted, the entire computer system could crash and could need to be rebooted.

Protected memory assigns programs their own areas of memory. If the operating system were to detect that a program has tried to alter memory that does not belong to it, the program could be terminated such that only the offending program would crash, and other programs would not be affected by the error.

Semiconductor Memory

Semiconductor memory is an electronic data storage device, often used as computer memory, implemented on a semiconductor-based integrated circuit. Most types of semiconductor memory have the property of random access, which means that it takes the same amount of time to access any memory location, so data can be efficiently accessed in any random order. Semiconductor memory also has much faster access times than other types of data storage such that a byte of data can be written to or read from semiconductor memory within a few nanoseconds. For these reasons, semiconductor memory is used for main computer memory (primary storage), to hold data the computer is currently working on, among other uses. Shift registers, processor registers, data buffers and other small digital registers that have no memory address decoding mechanism are not considered as memory although they also store digital data.

In a semiconductor memory chip/semiconductor computer memory circuit, each bit of binary data is stored in a tiny circuit called a memory cell consisting of one to several transistors. The memory cells are laid out in rectangular arrays on the surface of the chip such that 1-bit memory cells are grouped in small units called words (i.e., memory words) which are accessed together as a single memory address. Memory is manufactured in word length that is usually a power of two, typically N=1, 2, 4 or 8 bits. Data is accessed by means of a binary number called a memory address applied to the address pins of the memory chip, which specifies which word in the memory chip is to be accessed such that if the memory address consisted of M bits, the number of addresses on the chip would be $2^M$, with each address containing an N bit word. Consequently, the amount of data stored in each chip is $N2^M$ bits. The memory storage capacity for M number of address lines is given by $2^M$, which is usually in power of two (i.e., 2, 4, 8, 16, 32, 64, 128, 256, 512) and measured in kibibits, mebibits, gibibits or tebibits. By combining several integrated circuits, memory can be arranged into a larger word length and/or address space than what is offered by each chip, often but not necessarily a power of two.

The two basic operations performed by a memory chip are "read" (in which the data contents of a memory word is read out (nondestructively)) and "write" (in which data is stored in a memory word, replacing any data that was previously stored there). In order to increase data rate, in some of the latest types of memory chips (e.g., double data rate synchronous dynamic random-access memory (DDR SDRAM)), multiple words are accessed with each read or write operation. In addition to standalone memory chips, blocks of semiconductor memory are integral parts of many computer and data processing integrated circuits (e.g., the microprocessor chips that run computers contain cache memory to store instructions awaiting execution).

Memory Cell

A memory cell is the fundamental building block of computer memory where the memory cell is an electronic circuit that stores one bit of binary information and it must be set to store a logic 1 (high voltage level) and reset to store a logic 0 (low voltage level). The value of the memory cell is maintained/stored until it is changed by the set/reset process and can be accessed by reading it. A static RAM (SRAM) memory cell is a type of flip-flop circuit, usually implemented using FETs and requires require very low power when not being accessed. A DRAM memory cell is based around a capacitor where charging and discharging this capacitor can store a "1" or a "0" in the cell, where this capacitor slowly leaks away, and must be refreshed periodically, thereby using more power. The memory cell can be implemented using different technologies, such as bipolar, MOS, and other semiconductor devices.

The storage element of a DRAM memory cell is a capacitor labeled where the charge stored in the capacitor degrades over time, such that its value must be refreshed (read and rewritten) periodically. An nMOS transistor of the DRAM memory cell acts as a gate to allow reading or writing when open or storing when closed. For reading the contents of the DRAM memory cell, a word line drives a logic 1 (voltage high) into the gate of the nMOS transistor which makes it conductive, and the charge stored at the capacitor is then transferred to a bit line that has a parasitic capacitance that will drain part of the charge and slow the reading process. The parasitic capacitance of the bit line determines the needed size of the storage capacitor where if the storage capacitor is too small, the voltage of the bit line would take too much time to raise or not even rise above the threshold needed by the amplifiers at the end of the bit line.

Since the reading process degrades the charge in the storage capacitor, its value is rewritten after each read. When writing to the DRAM memory cell, the desired value logic 1 (high voltage) or logic 0 (low voltage) is driven into the bit line such that the word line activates the nMOS transistor connecting it to the storage capacitor, where the nMOS transistor must be turned on for enough time to ensure that the capacitor is fully charged or discharged before turning off the nMOS transistor.

Computer Memory Bus

A computer bus is a communication system that transfers data between components inside a computer, or between computers. A computer bus includes hardware components (e.g., wire, optical fiber) and software (e.g., communication protocols). A computer bus is any physical arrangement that provides the same logical function as a parallel electrical bus. Modern computer buses can use both parallel and bit serial connections, and can be wired in either a multidrop (electrical parallel) or daisy chain topology, or connected by switched hubs. A memory bus/computer memory bus is the computer bus which connects the main memory to the memory controller in computer systems. Modern memory buses are designed to connect directly to DRAM chips, and thus are designed by chip standards bodies.

In most traditional computer architectures, the CPU and main memory tend to be tightly coupled where the CPU (e.g., a microprocessor) conventionally is a single chip which has a number of electrical connections on its pins that can be used to select an "address" in the main memory and another set of pins to read and write the data stored at that location. In most cases, the CPU and memory share signaling characteristics and operate in synchrony such that the bus connecting the CPU and memory is one of the defining characteristics of the system, and often referred to simply as the system bus.

Buses can be parallel buses, which carry data words in parallel on multiple wires, or serial buses, which carry data in bit-serial form. The addition of extra power and control connections, differential drivers, and data connections in each direction usually means that most serial buses have more conductors than the minimum of one used in 1-Wire and UNI/O. As data rates increase, the problems of timing skew, power consumption, electromagnetic interference and crosstalk across parallel buses become more and more difficult to circumvent. One partial solution to this problem has been to double pump the bus. Often, a serial bus can be operated at higher overall data rates than a parallel bus, despite having fewer electrical connections, because a serial bus inherently has no timing skew or crosstalk.

Timing Skew

Clock skew (sometimes called timing skew) is a phenomenon in synchronous digital circuit systems (such as computer systems) in which the same sourced clock signal arrives at different components at different times. The operation of most digital circuits is synchronized by a periodic signal known as a "clock" that dictates the sequence and pacing of the devices on the circuit, where the clock is distributed from a single source to all the memory elements of the circuit (e.g., registers or flip-flops). In a circuit using edge-triggered registers, when the clock edge or tick arrives at a register, the register transfers the register input to the register output, and these new output values flow through combinational logic to provide the values at register inputs for the next clock tick. Ideally, the input to each memory element reaches its final value in time for the next clock tick so that the behavior of the whole circuit can be predicted exactly. The maximum speed at which a system can run must account for the variance that occurs between the various elements of a circuit due to differences in physical composition, temperature, and path length. In a synchronous circuit, two registers, or flip-flops, are said to be "sequentially adjacent" if a logic path connects them.

Crosstalk

Crosstalk is any phenomenon by which a signal transmitted on one circuit or channel of a transmission system creates an undesired effect in another circuit or channel. Crosstalk is usually caused by undesired capacitive, inductive, or conductive coupling from one circuit, part of a circuit, or channel, to another. In integrated circuit design, crosstalk normally refers to a signal affecting another nearby signal. Usually the coupling is capacitive, and to the nearest neighbor. However, other forms of coupling and effects on signal further away are sometimes important, especially in analog designs.

Computer Memory Controller

A memory controller/computer memory controller/computer memory controller circuit is a digital circuit that manages the flow of data going to and from the main memory of a computer/computer system. A memory controller can be a separate chip or integrated into another chip (e.g., being placed on the same die or as an integral part of a microprocessor (usually called an integrated memory controller (IMC)). A memory controller is sometimes also called a memory chip controller (MCC) or a memory controller unit (MCU). Memory controllers contain the logic necessary to read and write to DRAM, and to "refresh" the DRAM such that without constant refreshes, the DRAM would lose the data written to it as the capacitors of the DRAM leak their charge within a fraction of a second. Reading and writing to DRAM (by the memory controller) is performed by selecting the row and column data addresses of the DRAM as the inputs to the multiplexer circuit, where the demultiplexer on the DRAM uses the converted inputs to select the correct memory location and return the data, which is then passed back through a multiplexer to consolidate the data to reduce the required bus width for the operation.

Bus width is the number of parallel lines available to communicate with the memory cell. Bus widths of memory controllers range from 8-bit in earlier systems, to 512-bit in more complicated systems and video cards (typically implemented as four 64-bit simultaneous memory controllers operating in parallel, though some are designed to operate in "gang mode" where two 64-bit memory controllers can be used to access a 128-bit memory device). Some memory controllers can be connected to different kinds of devices at the same time, including SDRAM, SRAM, ROM, and memory-mapped I/O, where each kind of these devices requires a slightly different control bus, while the memory controller presents a common system bus/front-side bus to the processor. Some memory controllers include error detection and correction hardware.

Dual In-Line Memory Module (DIMM)

A dual in-line memory module (DIMM) includes a series of dynamic random-access memory integrated circuits where these modules are mounted on a printed circuit board and designed for use in personal computers, workstations and servers. DIMMs have separate electrical contacts on each side of the module, and standard DIMMs have a 64-bit data path. The capacity of a DIMM capacity and other operational parameters of the DIMM may be identified with serial presence detect (SPD), an additional chip which contains information about the module type and timing for the memory controller to be configured correctly where the SPD EEPROM connects to the System Management Bus and may also contain thermal sensors (TS-on-DIMM).

ECC DIMMs

Error-correcting code memory (ECC memory) is a type of computer data storage that can detect and correct the most common kinds of internal data corruption. ECC memory is used in most computers where data corruption cannot be tolerated under any circumstances, such as for scientific or financial computing. Typically, ECC memory maintains a memory system immune to single-bit errors such that the data that is read from each word is always the same as the data that had been written to it, even if one or more bits actually stored have been flipped to the wrong state. Most non-ECC memory cannot detect errors although some non-ECC memory with parity support allows detection but not correction.

Error-correcting code (ECC) DIMMs are those that have extra data bits which can be used by the system memory controller to detect and correct errors. Numerous ECC schemes exist, with perhaps the most common ECC scheme being single error correct, double error detect (SECDED) which uses an extra byte per 64-bit word. ECC modules usually carry a multiple of 9 instead of a multiple of 8 chips.

Ranking

Sometimes memory modules are designed with two or more independent sets of DRAM chips connected to the same address and data buses such that each such set is called a rank/memory rank. Since all ranks share the same buses, only one rank may be accessed at any given time where it is specified by activating the chip select (CS) signal of the corresponding rank. All other ranks are deactivated for the duration of the operation by having their corresponding CS signals deactivated. After a memory word is fetched, the memory is typically inaccessible for an extended period of time while the sense amplifiers are charged for access of the next cell. By interleaving the memory (e.g., cells 0, 4, 8, etc. being stored together in one rank), sequential memory accesses can be performed more rapidly because sense amplifiers have 3 cycles of idle time for recharging, between accesses.

Row Address Select (RAS)

Row address select (strobe) (RAS) circuitry in a DRAM circuit is used to latch the row address and to initiate the memory cycle and is required at the beginning of every operation in a DRAM. RAS is active low such that in order to enable RAS, a transition from a high voltage to a low voltage level is required, and the voltage must remain low until RAS is no longer needed. During a complete DRAM memory cycle, there is a minimum amount of time that RAS must be active (tRAS), and a minimum amount of time that RAS must be inactive, called the RAS precharge time (tRP). RAS may also be used to trigger a refresh cycle (RAS Only Refresh, or ROR).

RAM Timings

Four RAM timings/timing values control various timings related to how the memory controller talks to a RAM. Column address strobe (CAS) Latency (tCL), describes, if a row has already been selected, how many clock cycles will have to elapse before a result from the RAM is obtained (after sending a column address to the RAM controller). Row address (RAS) to column address (CAS) Delay (tRCD) indicates, once a row address is sent to the memory controller, how many clock cycles will have to elapse before one of the columns of the row is accessed, such that if a row has not been selected, tRCD+tCL cycles would have to elapse before a result from the RAM is obtained. Row precharge time (tRP) indicates, if a row is already selected, how many clock cycles will have to elapse before a different row can be selected, such that it will take tRP+tRCD+tCL cycles to access the data in a different row. Row active time (tRAS) indicates the minimum number of clock cycles that a row has to be active in order to have enough time to access the information that is in the row, where tRAS usually needs to be greater than or equal to the sum of the previous three latencies (tRAS=tCL+tRCD+tRP). A lower RAM timing value is better.

Need to Assess Memory Reliability of Memory Arrays in the Field

Advancements in computer memory technology allow denser integration to achieve higher memory capacity requirements, demanded by the latest computer and server systems. Three-dimensional (3D) integration enables stacking of multiple DRAM chips with interconnections of signals among them using through silicon vias (TSVs). As the technology node shrinks and packaging density increases, memory cell level issues are aggravated, thus impacting data reliability. Also, increased temperature gradients among stacked chips further aggravate thermal related data integrity issues. In addition, advanced computer memory technology nodes have more exposure to soft error rates and latent defects/failure rates in the field. Notably, certain types of memory cell failures are accelerated by signals with short timing parameters and would exhibit as a lack of the ability to change in data level (0−>1 or 1−>0) in such memory cells. Also, less reliable cells would be exposed to more cell failures. In addition, field level degradation of memory arrays would have impact on the voltage drifts, while signal timing changes would further adversely impact data retention ability of cells that are having exposure to reliability issues.

RAS techniques exist to address soft error rate (SER) in DRAMs, and to repair and to protect against memory array related issues in the field (e.g., scrub, row repair, chipkill) protects the field to ensure reliable and sustained operation. Some current memory cell tests (e.g., read retry, and then write and read) attempt to classify errors encountered, but, do not do so for a full region of the memory array. However, there are no techniques that exist today to constantly assess the memory reliability of memory arrays in the field to proactively identify reliability related issues and mitigate them, which otherwise would manifest as significant errors that could adversely affect system operation. A method and approach to assess memory reliability of computer memory arrays in the field and to mitigate discovered issues proactively, in order to ensure reliable memory system operation.

Referring to FIG. 1A, in an exemplary embodiment, the present invention is configured to perform an operation 110 of taking control, by a host computer system, of a portion of a computer memory circuit, an operation 112 of utilizing, by the host computer system, a portion of a computer memory bus, where the portion of the computer memory bus is associated with the portion of the computer memory circuit, an operation 114 of moving, by the host computer system, computer memory circuit data stored in the portion of the computer memory circuit to a host computer storage device, an operation 116 of executing, by the host computer system, a set of logical operations assessing reliability of the portion of the computer memory circuit, resulting in assessment data stored in a reliability error monitor (REM) computer storage device, an operation 118 of transmitting, by the host computer system, the stored assessment data from the REM computer storage device to a computer memory controller circuit, and an operation 120 of in response to the transmitting, moving, by the host computer system, the moved computer memory circuit data from the host computer storage device back to the portion of the computer memory circuit.

In an embodiment, the present invention enables field reliability assessment of memory cells and proactively mitigates problems identified by such assessment by suitable control actions. For example, the present invention could perform reliability testing of computer memories in the middle of a computer system running workloads, at run time, where such testing would need exclusive access to a computer memory bus and a computer memory circuit/array. Specifically, for example, the present invention could take exclusive control of a portion of a computer memory circuit. In an embodiment, the present invention takes complete control of a memory bus logically coupled to the memory to support changes of timing parameters of control signals for the memory. In an embodiment, the present invention evacuates customer data or moves such data to spare memory or a free area of memory, so that the memory area under "reliability assessment" can be loaded & evaluated for custom data patterns. In an embodiment, the present invention tests memory cells to detect progressive fail mechanism during run time, such that the present invention stops normal operation of the memory cells and executes cell tests to reveal fail conditions in the cells. In a further embodiment, the present invention assesses the reliability of memory cells with respect to electrical (voltage) and other parameters (temperature driven).

Figure 4:
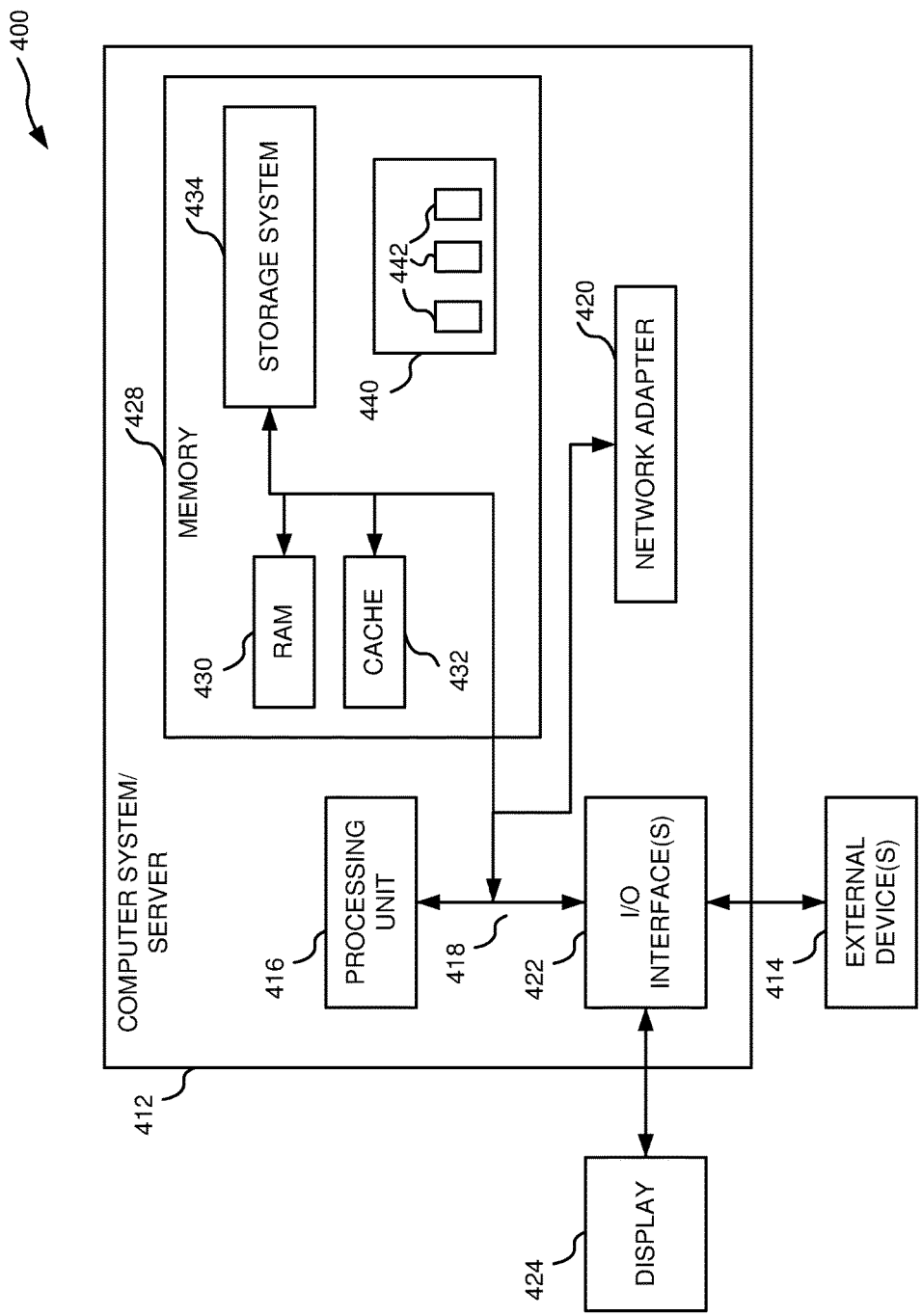
FIG. 4 depicts a computer system in accordance with an exemplary embodiment of the present invention.

In an embodiment, the host computer system is a computer system 400 as shown in FIG. 4, that executes an assessing in-field reliability of computer memories script or computer software application that carries out the operations of at least method 100. In an embodiment, the host computer system is a computer system/server 412 as shown in FIG. 4, that executes an assessing in-field reliability of computer memories script or computer software application that carries out the operations of at least method 100. In an embodiment, the host computer system is a processing unit 416 as shown in FIG. 4, that executes an assessing in-field reliability of computer memories script or computer software application that carries out the operations of at least method 100. In an embodiment, the host computer system is a computer memory controller circuit that executes an assessing in-field reliability of computer memories script or computer software application that carries out the operations of at least method 100. In an embodiment, the host computer system is a computer system 400 as shown in FIG. 4, that executes an assessing in-field reliability of computer memories script or computer software application that carries out at least operations 110, 112, 114, 116, 118, and 120. In an embodiment, the host computer system is a computer system/server 412 as shown in FIG. 4, that executes an assessing in-field reliability of computer memories script or computer software application that carries out at least operations 110, 112, 114, 116, 118, and 120. In an embodiment, the host computer system is a processing unit 416 as shown in FIG. 4, that executes an assessing in-field reliability of computer memories script or computer software application that carries out at least operations 110, 112, 114, 116, 118, and 120. In an embodiment, the host computer system is a computer memory controller circuit that executes an assessing in-field reliability of computer memories script or computer software application that carries out at least operations 110, 112, 114, 116, 118, and 120.

Figure 1B:
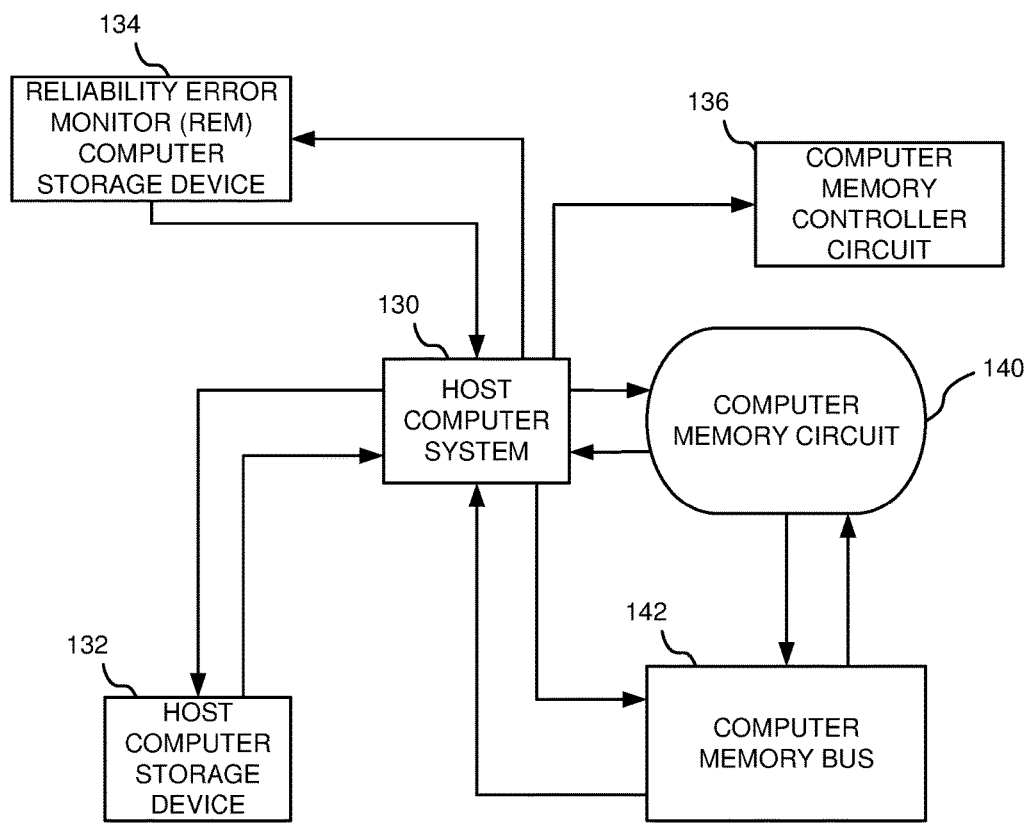
FIG. 1B depicts a block diagram in accordance with an exemplary embodiment of the present invention.
Figure 1C:
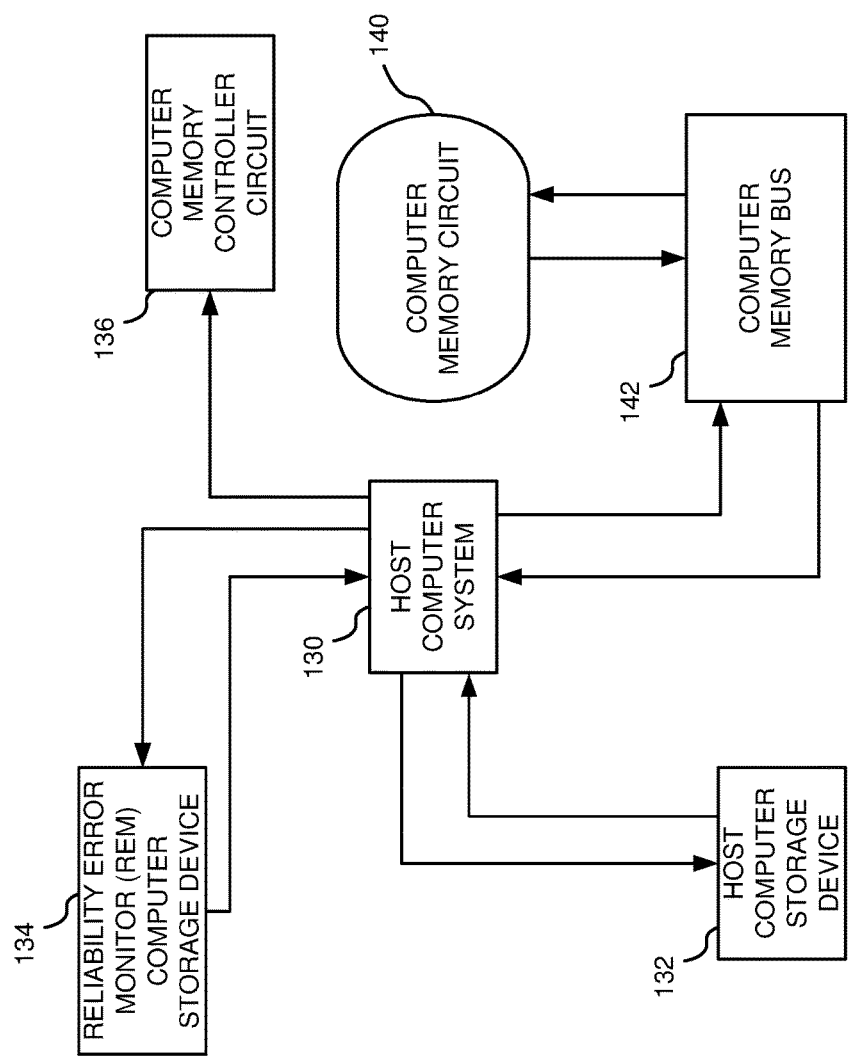
FIG. 1C depicts a block diagram in accordance with an exemplary embodiment of the present invention.

Referring to FIG. 1B and FIG. 1C, in an exemplary embodiment, the present invention includes a host computer system 130, a host computer storage device 132, a reliability error monitor (REM) computer storage device 134, and a computer memory controller circuit 136. In a particular embodiment, host computer system 130 includes computer memory controller circuit 136. In a specific embodiment, host computer system 130 is computer memory controller circuit 136.

In an embodiment, host computer system 130 is configured to take control of a portion of computer memory circuit 140. In an embodiment, host computer system 130 includes a computer system, such as computer system 400 as shown in FIG. 4, performing operation 110. In an embodiment, host computer system 130 includes a computer system, such as computer system/server 412 as shown in FIG. 4, performing operation 110. In an embodiment, host computer system 130 includes a computer system, such as processing unit 416 as shown in FIG. 4, performing operation 110. In an embodiment, host computer system 130 is a computer memory controller circuit performing operation 110. In an embodiment, host computer system 130 is computer memory controller circuit 136 performing operation 110. In an embodiment, host computer system 130 is implemented as computer software executing on a computer system, such as computer system 400 as shown in FIG. 4, such that the computer system performs operation 110. In an embodiment, host computer system 130 is implemented as computer software executing on a computer system, such as computer system/server 412 as shown in FIG. 4, such that the computer system performs operation 110. In an embodiment, host computer system 130 is implemented as computer software executing on a computer system, such as processing unit 416 as shown in FIG. 4 such that the computer system performs operation 110. In an embodiment, host computer system 130 is implemented as computer software executing on a computer system, such as a computer memory controller circuit, such that the computer system performs operation 110. In an embodiment, host computer system 130 is implemented as computer software executing on a computer system, such as computer memory controller circuit 136, such that the computer system performs operation 110. In a particular embodiment, host computer system 130 is configured to take control of a portion of computer memory circuit 140 via computer memory bus 142.

In an embodiment, host computer system 130 is configured to utilize a portion of computer memory bus 142, where the portion of computer memory bus 142 is associated with the portion of the computer memory circuit 140. In an embodiment, host computer system 130 includes a computer system, such as computer system 400 as shown in FIG. 4, performing operation 112. In an embodiment, host computer system 130 includes a computer system, such as computer system/server 412 as shown in FIG. 4, performing operation 112. In an embodiment, host computer system 130 includes a computer system, such as processing unit 416 as shown in FIG. 4, performing operation 112. In an embodiment, host computer system 130 is a computer memory controller circuit performing operation 112. In an embodiment, host computer system 130 is computer memory controller circuit 136 performing operation 112. In an embodiment, host computer system 130 is implemented as computer software executing on a computer system, such as computer system 400 as shown in FIG. 4, such that the computer system performs operation 112. In an embodiment, host computer system 130 is implemented as computer software executing on a computer system, such as computer system/server 412 as shown in FIG. 4, such that the computer system performs operation 112. In an embodiment, host computer system 130 is implemented as computer software executing on a computer system, such as processing unit 416 as shown in FIG. 4 such that the computer system performs operation 112. In an embodiment, host computer system 130 is implemented as computer software executing on a computer system, such as a computer memory controller circuit, such that the computer system performs operation 112. In an embodiment, host computer system 130 is implemented as computer software executing on a computer system, such as computer memory controller circuit 136, such that the computer system performs operation 112. For example, if host computer system 130 were to evaluate a large portion of computer memory circuit 140, then host computer system 130 could take control of the entirety of computer memory bus 142. For example, if host computer system 130 were to evaluate a small portion of computer memory circuit 140, then host computer system 130 could take control of a correspondingly small portion of computer memory bus 142.

In an embodiment, host computer system 130 is configured to move computer memory circuit data stored in the portion of computer memory circuit 140 to host computer storage device 132. In an embodiment, host computer system 130 includes a computer system, such as computer system 400 as shown in FIG. 4, performing operation 114. In an embodiment, host computer system 130 includes a computer system, such as computer system/server 412 as shown in FIG. 4, performing operation 114. In an embodiment, host computer system 130 includes a computer system, such as processing unit 416 as shown in FIG. 4, performing operation 114. In an embodiment, host computer system 130 is a computer memory controller circuit performing operation 114. In an embodiment, host computer system 130 is computer memory controller circuit 136 performing operation 114. In an embodiment, host computer system 130 is implemented as computer software executing on a computer system, such as computer system 400 as shown in FIG. 4, such that the computer system performs operation 114.

In an embodiment, host computer system 130 is implemented as computer software executing on a computer system, such as computer system/server 412 as shown in FIG. 4, such that the computer system performs operation 114. In an embodiment, host computer system 130 is implemented as computer software executing on a computer system, such as processing unit 416 as shown in FIG. 4 such that the computer system performs operation 114. In an embodiment, host computer system 130 is implemented as computer software executing on a computer system, such as a computer memory controller circuit, such that the computer system performs operation 114. In an embodiment, host computer system 130 is implemented as computer software executing on a computer system, such as computer memory controller circuit 136, such that the computer system performs operation 114.

In an embodiment, host computer system 130 is configured to execute a set of logical operations assessing reliability of the portion of computer memory circuit 140, resulting in assessment data stored in REM computer storage device 134. In an embodiment, host computer system 130 includes a computer system, such as computer system 400 as shown in FIG. 4, performing operation 116. In an embodiment, host computer system 130 includes a computer system, such as computer system/server 412 as shown in FIG. 4, performing operation 116. In an embodiment, host computer system 130 includes a computer system, such as processing unit 416 as shown in FIG. 4, performing operation 116. In an embodiment, host computer system 130 is a computer memory controller circuit performing operation 116. In an embodiment, host computer system 130 is computer memory controller circuit 136 performing operation 116. In an embodiment, host computer system 130 is implemented as computer software executing on a computer system, such as computer system 400 as shown in FIG. 4, such that the computer system performs operation 116. In an embodiment, host computer system 130 is implemented as computer software executing on a computer system, such as computer system/server 412 as shown in FIG. 4, such that the computer system performs operation 116. In an embodiment, host computer system 130 is implemented as computer software executing on a computer system, such as processing unit 416 as shown in FIG. 4 such that the computer system performs operation 116. In an embodiment, host computer system 130 is implemented as computer software executing on a computer system, such as a computer memory controller circuit, such that the computer system performs operation 116. In an embodiment, host computer system 130 is implemented as computer software executing on a computer system, such as computer memory controller circuit 136, such that the computer system performs operation 116.

In an embodiment, host computer system 130 is configured to transmit the stored assessment data from REM computer storage device 134 to computer memory controller circuit 136. In an embodiment, host computer system 130 includes a computer system, such as computer system 400 as shown in FIG. 4, performing operation 118. In an embodiment, host computer system 130 includes a computer system, such as computer system/server 412 as shown in FIG. 4, performing operation 118. In an embodiment, host computer system 130 includes a computer system, such as processing unit 416 as shown in FIG. 4, performing operation 118. In an embodiment, host computer system 130 is a computer memory controller circuit performing operation 118. In an embodiment, host computer system 130 is computer memory controller circuit 136 performing operation 118. In an embodiment, host computer system 130 is implemented as computer software executing on a computer system, such as computer system 400 as shown in FIG. 4, such that the computer system performs operation 118. In an embodiment, host computer system 130 is implemented as computer software executing on a computer system, such as computer system/server 412 as shown in FIG. 4, such that the computer system performs operation 118. In an embodiment, host computer system 130 is implemented as computer software executing on a computer system, such as processing unit 416 as shown in FIG. 4 such that the computer system performs operation 118. In an embodiment, host computer system 130 is implemented as computer software executing on a computer system, such as a computer memory controller circuit, such that the computer system performs operation 118. In an embodiment, host computer system 130 is implemented as computer software executing on a computer system, such as computer memory controller circuit 136, such that the computer system performs operation 118.

In an embodiment, host computer system 130 is configured to move, in response to the transmitting, the moved computer memory circuit data from host computer storage device 132 back to the portion of the computer memory circuit 140. In an embodiment, host computer system 130 includes a computer system, such as computer system 400 as shown in FIG. 4, performing operation 120. In an embodiment, host computer system 130 includes a computer system, such as computer system/server 412 as shown in FIG. 4, performing operation 120. In an embodiment, host computer system 130 includes a computer system, such as processing unit 416 as shown in FIG. 4, performing operation 120. In an embodiment, host computer system 130 is a computer memory controller circuit performing operation 120. In an embodiment, host computer system 130 is computer memory controller circuit 136 performing operation 120. In an embodiment, host computer system 130 is implemented as computer software executing on a computer system, such as computer system 400 as shown in FIG. 4, such that the computer system performs operation 120. In an embodiment, host computer system 130 is implemented as computer software executing on a computer system, such as computer system/server 412 as shown in FIG. 4, such that the computer system performs operation 120. In an embodiment, host computer system 130 is implemented as computer software executing on a computer system, such as processing unit 416 as shown in FIG. 4 such that the computer system performs operation 120. In an embodiment, host computer system 130 is implemented as computer software executing on a computer system, such as a computer memory controller circuit, such that the computer system performs operation 120. In an embodiment, host computer system 130 is implemented as computer software executing on a computer system, such as computer memory controller circuit 136, such that the computer system performs operation 120.

Figure 1D:
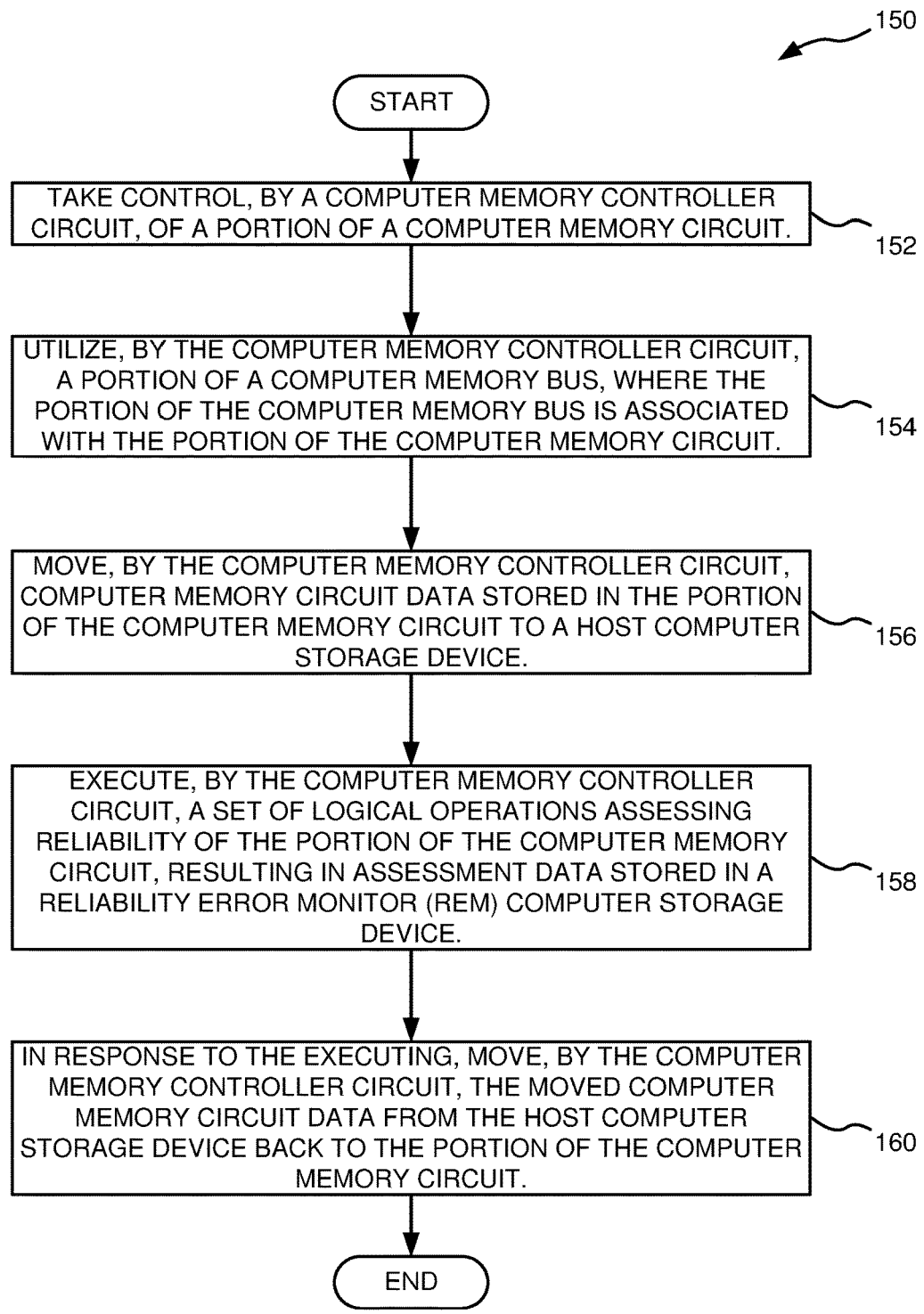
FIG. 1D depicts a flowchart in accordance with an exemplary embodiment of the present invention.

Referring to FIG. 1D, in a particular embodiment, the present invention is configured to perform an operation 152 of taking control, by a computer memory controller circuit, of a portion of a computer memory circuit, an operation 154 of utilizing, by the computer memory controller circuit, a portion of a computer memory bus, where the portion of the computer memory bus is associated with the portion of the computer memory circuit, an operation 156 of moving, by the computer memory controller circuit, computer memory circuit data stored in the portion of the computer memory circuit to a host computer storage device, an operation 158 of executing, by the computer memory controller circuit, a set of logical operations assessing reliability of the portion of the computer memory circuit, resulting in assessment data stored in a reliability error monitor (REM) computer storage device, and an operation 160 of in response to the executing, moving, by the computer memory controller circuit, the moved computer memory circuit data from the host computer storage device back to the portion of the computer memory circuit.

In an embodiment, the computer memory controller circuit executes an assessing in-field reliability of computer memories script or computer software application that carries out the operations of at least method 150. In an embodiment, the computer memory controller circuit executes an assessing in-field reliability of computer memories script or computer software application that carries out at least operations 152, 154, 156, 158, and 160.

Figure 1E:
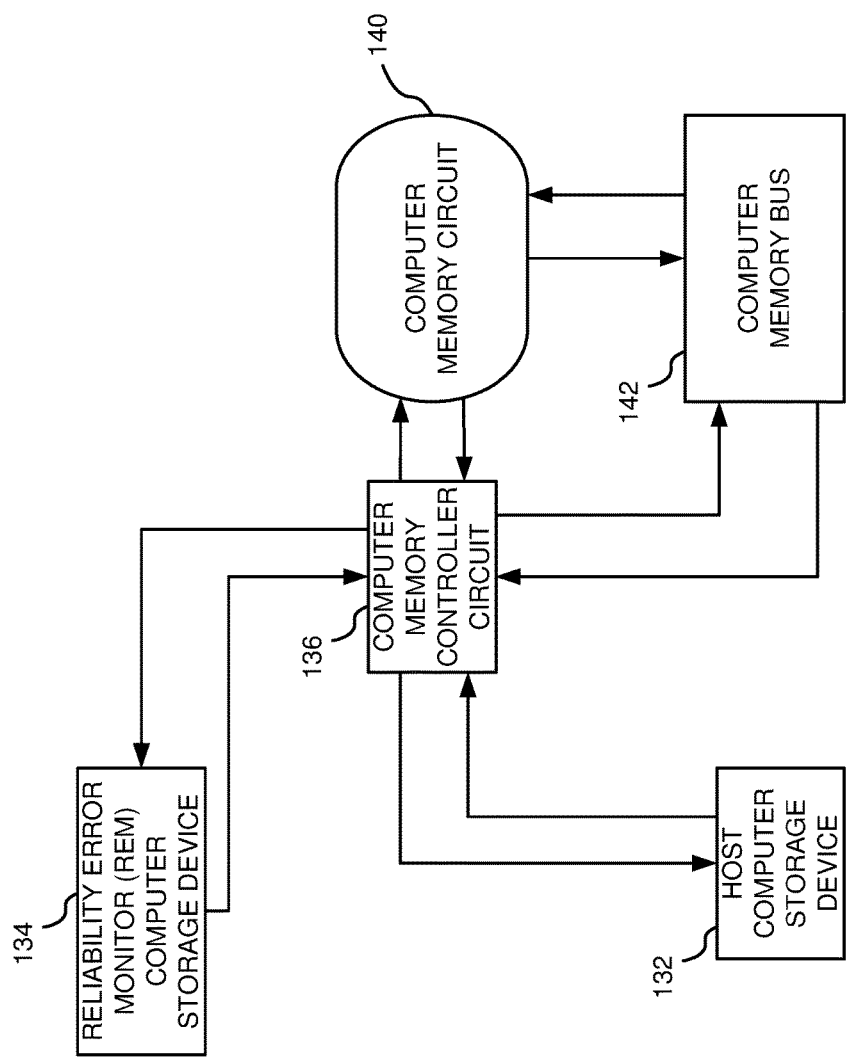
FIG. 1E depicts a block diagram in accordance with an exemplary embodiment of the present invention.
Figure 1F:
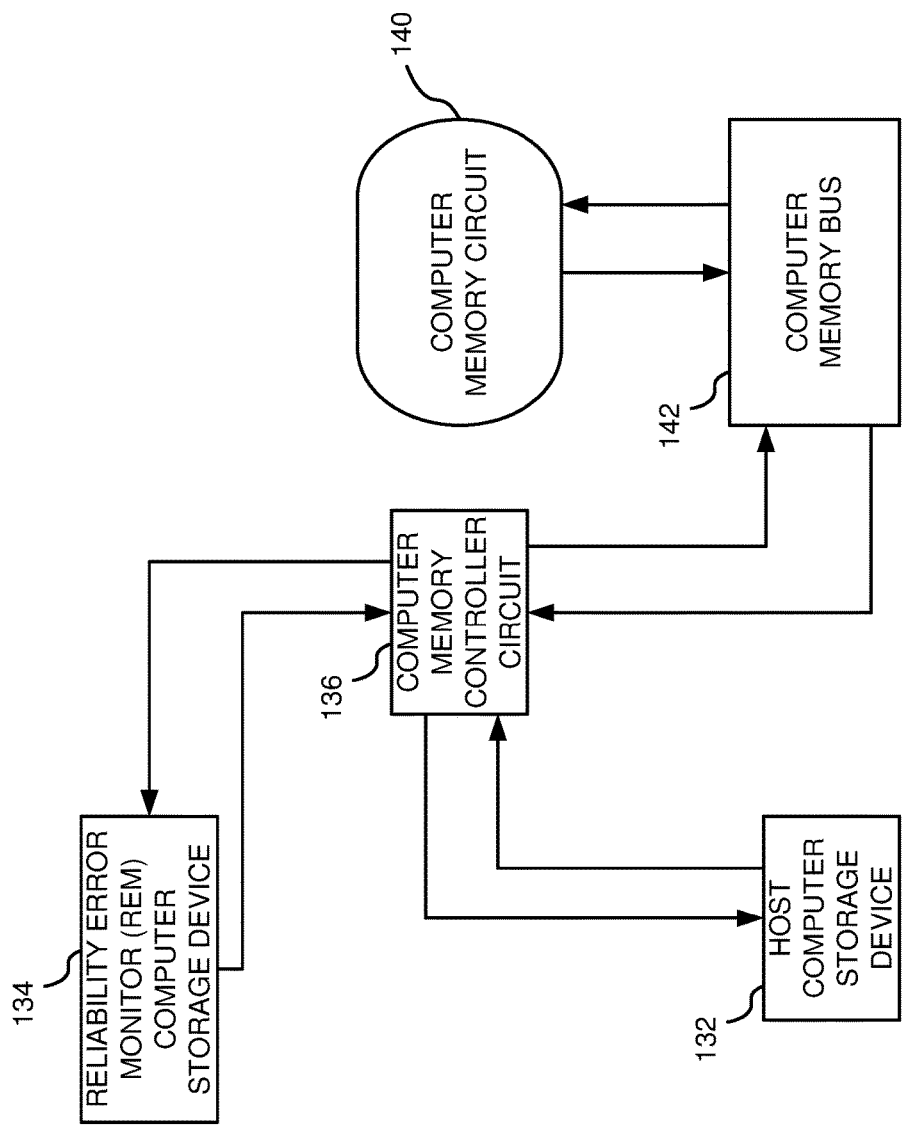
FIG. 1F depicts a block diagram in accordance with an exemplary embodiment of the present invention.

Referring to FIG. 1E and FIG. 1F, in an exemplary embodiment, the present invention includes computer memory controller circuit 136, host computer storage device 132, and reliability error monitor (REM) computer storage device 134. In an embodiment, computer memory controller circuit 136 is configured to take control of a portion of computer memory circuit 140. In an embodiment, computer memory controller circuit 136 performs operation 152. In a particular embodiment, computer memory controller circuit 136 is configured to take control of a portion of computer memory circuit 140 via computer memory bus 142.

In an embodiment, computer memory controller circuit 136 is configured to utilize a portion of computer memory bus 142, where the portion of computer memory bus 142 is associated with the portion of the computer memory circuit 140. In an embodiment, computer memory controller circuit 136 performs operation 154. For example, if computer memory controller circuit 136 were to evaluate a large portion of computer memory circuit 140, then computer memory controller circuit 136 could take control of the entirety of computer memory bus 142. For example, if computer memory controller circuit 136 were to evaluate a small portion of computer memory circuit 140, then computer memory controller circuit 136 could take control of a correspondingly small portion of computer memory bus 142.

In an embodiment, computer memory controller circuit 136 is configured to move computer memory circuit data stored in the portion of computer memory circuit 140 to host computer storage device 132. In an embodiment, computer memory controller circuit 136 performs operation 156. In a particular embodiment, computer memory controller circuit 136 is configured to move computer memory circuit data stored in the portion of computer memory circuit 140 to host computer storage device 132 via computer memory bus 142.

In an embodiment, computer memory controller circuit 136 is configured to execute a set of logical operations assessing reliability of the portion of computer memory circuit 140, resulting in assessment data stored in REM computer storage device 134. In an embodiment, computer memory controller circuit 136 performs operation 158. In an embodiment, computer memory controller circuit 136 is configured to move, in response to the executing, the moved computer memory circuit data from host computer storage device 132 back to the portion of the computer memory circuit 140. In an embodiment computer memory controller circuit 136 performs operation 160. In a particular embodiment, computer memory controller circuit 136 is configured to move, in response to the executing, the moved computer memory circuit data from host computer storage device 132 back to the portion of the computer memory circuit 140 via computer memory bus 142.

Taking Control of Computer Memory Circuit

In an exemplary embodiment, the taking control includes taking exclusive control of the portion of the computer memory circuit. In an embodiment, taking control operation 110 includes taking exclusive control of the portion of the computer memory circuit. In an embodiment, host computer system 130 is configured to take exclusive control of the portion of computer memory circuit 140. In an embodiment, host computer system 130 includes a computer system, such as computer system 400 as shown in FIG. 4, taking exclusive control of the portion of computer memory circuit 140. In an embodiment, host computer system 130 includes a computer system, such as computer system/server 412 as shown in FIG. 4, taking exclusive control of the portion of computer memory circuit 140. In an embodiment, host computer system 130 includes a computer system, such as processing unit 416 as shown in FIG. 4, taking exclusive control of the portion of computer memory circuit 140. In an embodiment, host computer system 130 includes a computer system, such as a computer memory controller circuit, taking exclusive control of the portion of computer memory circuit 140. In an embodiment, host computer system 130 includes a computer system, such as computer memory controller circuit 136, taking exclusive control of the portion of computer memory circuit 140. For example, host computer system 130 could take control of the portion of computer memory circuit 140 by fencing off the portion of computer memory circuit 140 from other computer processes such that those other computer processes could not access the portion of computer memory circuit 140.

In an embodiment, host computer system 130 is implemented as computer software executing on a computer system, such as computer system 400 as shown in FIG. 4, such that the computer system takes exclusive control of the portion of computer memory circuit 140. In an embodiment, host computer system 130 is implemented as computer software executing on a computer system, such as computer system/server 412 as shown in FIG. 4, such that the computer system takes exclusive control of the portion of computer memory circuit 140. In an embodiment, host computer system 130 is implemented as computer software executing on a computer system, such as processing unit 416 as shown in FIG. 4, such that the computer system takes exclusive control of the portion of computer memory circuit 140. In an embodiment, host computer system 130 is implemented as computer software executing on a computer system, such as a computer memory controller circuit, such that the computer system takes exclusive control of the portion of computer memory circuit 140. In an embodiment, host computer system 130 is implemented as computer software executing on a computer system, such as computer memory controller circuit 136, such that the computer system takes exclusive control of the portion of computer memory circuit 140. In an embodiment, host computer system 130 takes exclusive control of the portion of computer memory circuit 140 as computer software executing on a processor of host computer system 130. In an embodiment, host computer system 130 takes exclusive control of the portion of computer memory circuit 140 as computer software executing on a computer memory controller circuit. In an embodiment, host computer system 130 takes exclusive control of the portion of computer memory circuit 140 as computer software executing on computer memory controller circuit 136.

In an embodiment, computer memory controller circuit 136 is configured to take exclusive control of the portion of computer memory circuit 140. In an embodiment, computer memory controller circuit 136 takes exclusive control of the portion of computer memory circuit 140. For example, computer memory controller circuit 136 could take control of the portion of computer memory circuit 140 by fencing off the portion of computer memory circuit 140 from other computer processes such that those other computer processes could not access the portion of computer memory circuit 140. In an embodiment, computer memory controller circuit 136 takes exclusive control of the portion of computer memory circuit 140 as computer software executing on computer memory controller circuit 136.

Assessing Reliability

Figure 2:
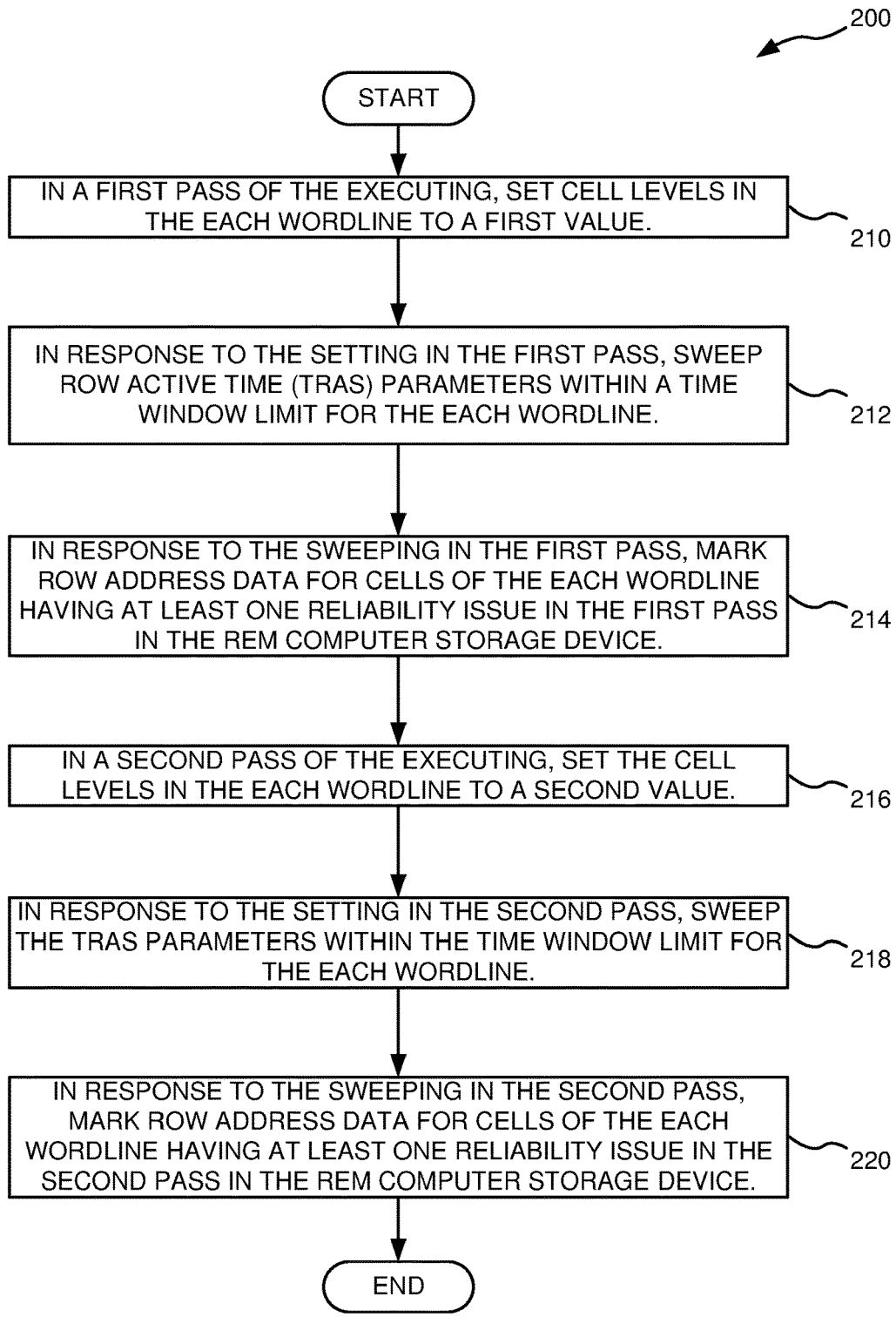
FIG. 2 depicts a flowchart in accordance with an exemplary embodiment of the present invention.

In an exemplary embodiment, the executing includes, for each wordline of the portion of the computer memory circuit, (a) in a first pass of the executing, setting cell levels in the each wordline to a first value, (b) in response to the setting in the first pass, sweeping row active time (tRAS) parameters within a time window limit for the each wordline, (c) in response to the sweeping in the first pass, marking row address data for cells of the each wordline having at least one reliability issue in the first pass in the REM computer storage device, (d) in a second pass of the executing, setting the cell levels in the each wordline to a second value, (e) in response to the setting in the second pass, sweeping the tRAS parameters within the time window limit for the each wordline, and (f) in response to the sweeping in the second pass, marking row address data for cells of the each wordline having at least one reliability issue in the second pass in the REM computer storage device. Referring to FIG. 2, in an exemplary embodiment, executing operation 116 includes an operation 210 of in a first pass of the executing, setting cell levels in the each wordline to a first value, an operation 212 of in response to the setting in the first pass, sweeping row active time (tRAS) parameters within a time window limit for the each wordline, an operation 214 of in response to the sweeping in the first pass, marking row address data for cells of the each wordline having at least one reliability issue in the first pass in the REM computer storage device, an operation 216 of in a second pass of the executing, setting the cell levels in the each wordline to a second value, an operation 218 of in response to the setting in the second pass, sweeping the tRAS parameters within the time window limit for the each wordline, and an operation 220 of in response to the sweeping in the second pass, marking row address data for cells of the each wordline having at least one reliability issue in the second pass in the REM computer storage device.

In an embodiment, the host computer system is a computer system 400 as shown in FIG. 4, that executes an assessing in-field reliability of computer memories script or computer software application that carries out the operations of at least method 200. In an embodiment, the host computer system is a computer system/server 412 as shown in FIG. 4, that executes an assessing in-field reliability of computer memories script or computer software application that carries out the operations of at least method 200. In an embodiment, the host computer system is a processing unit 416 as shown in FIG. 4, that executes an assessing in-field reliability of computer memories script or computer software application that carries out the operations of at least method 200. In an embodiment, the host computer system is a computer memory controller circuit that executes an assessing in-field reliability of computer memories script or computer software application that carries out the operations of at least method 200. In an embodiment, the host computer system is computer memory controller circuit 136 that executes an assessing in-field reliability of computer memories script or computer software application that carries out the operations of at least method 200. In an embodiment, the host computer system is a computer system 400 as shown in FIG. 4, that executes an assessing in-field reliability of computer memories script or computer software application that carries out at least operations 210, 212, 214, 216, 218, and 220. In an embodiment, the host computer system is a computer system/server 412 as shown in FIG. 4, that executes an assessing in-field reliability of computer memories script or computer software application that carries out at least operations 210, 212, 214, 216, 218, and 220. In an embodiment, the host computer system is a processing unit 416 as shown in FIG. 4, that executes an assessing in-field reliability of computer memories script or computer software application that carries out at least operations 210, 212, 214, 216, 218, and 220. In an embodiment, the host computer system is a computer memory controller circuit that executes an assessing in-field reliability of computer memories script or computer software application that carries out at least operations 210, 212, 214, 216, 218, and 220. In an embodiment, the host computer system is computer memory controller circuit 136 that executes an assessing in-field reliability of computer memories script or computer software application that carries out at least operations 210, 212, 214, 216, 218, and 220.

In an embodiment, host computer system 130 is configured to set, in a first pass of the executing, cell levels in the each wordline to a first value. In an embodiment, host computer system 130 includes a computer system, such as computer system 400 as shown in FIG. 4, performing operation 210. In an embodiment, host computer system 130 includes a computer system, such as computer system/server 412 as shown in FIG. 4, performing operation 210. In an embodiment, host computer system 130 includes a computer system, such as processing unit 416 as shown in FIG. 4, performing operation 210. In an embodiment, host computer system 130 is a computer memory controller circuit performing operation 210. In an embodiment, host computer system 130 is computer memory controller circuit 136 performing operation 210. In an embodiment, host computer system 130 is implemented as computer software executing on a computer system, such as computer system 400 as shown in FIG. 4, such that the computer system performs operation 210. In an embodiment, host computer system 130 is implemented as computer software executing on a computer system, such as computer system/server 412 as shown in FIG. 4, such that the computer system performs operation 210. In an embodiment, host computer system 130 is implemented as computer software executing on a computer system, such as processing unit 416 as shown in FIG. 4 such that the computer system performs operation 210. In an embodiment, host computer system 130 is implemented as computer software executing on a computer system, such as a computer memory controller circuit, such that the computer system performs operation 210. In an embodiment, host computer system 130 is implemented as computer software executing on a computer system, such as computer memory controller circuit 136, such that the computer system performs operation 210. In an embodiment, host computer system 130 sets, in a first pass of the executing, cell levels in the each wordline to a first value as computer software executing on a processor of host computer system 130. In an embodiment, host computer system 130 sets, in a first pass of the executing, cell levels in the each wordline to a first value as computer software executing on a computer memory controller circuit. In an embodiment, host computer system 130 sets, in a first pass of the executing, cell levels in the each wordline to a first value as computer software executing on computer memory controller circuit 136. In a particular embodiment, the first value is a digital logic one (1). In an alternative embodiment, the first value is a digital logic zero (0).

In an embodiment, host computer system 130 is configured to sweep, in response to the setting in the first pass, tRAS parameters within a time window limit for the each wordline. In an embodiment, host computer system 130 includes a computer system, such as computer system 400 as shown in FIG. 4, performing operation 212. In an embodiment, host computer system 130 includes a computer system, such as computer system/server 412 as shown in FIG. 4, performing operation 212. In an embodiment, host computer system 130 includes a computer system, such as processing unit 416 as shown in FIG. 4, performing operation 212. In an embodiment, host computer system 130 is a computer memory controller circuit performing operation 212. In an embodiment, host computer system 130 is computer memory controller circuit 136 performing operation 212. In an embodiment, host computer system 130 is implemented as computer software executing on a computer system, such as computer system 400 as shown in FIG. 4, such that the computer system performs operation 212. In an embodiment, host computer system 130 is implemented as computer software executing on a computer system, such as computer system/server 412 as shown in FIG. 4, such that the computer system performs operation 212. In an embodiment, host computer system 130 is implemented as computer software executing on a computer system, such as processing unit 416 as shown in FIG. 4 such that the computer system performs operation 212. In an embodiment, host computer system 130 is implemented as computer software executing on a computer system, such as a computer memory controller circuit, such that the computer system performs operation 212. In an embodiment, host computer system 130 is implemented as computer software executing on a computer system, such as computer memory controller circuit 136, such that the computer system performs operation 212. In an embodiment, host computer system 130 sweeps, in response to the setting in the first pass, tRAS parameters within a time window limit for the each wordline as computer software executing on a processor of host computer system 130. In an embodiment, host computer system 130 sweeps, in response to the setting in the first pass, tRAS parameters within a time window limit for the each wordline as computer software executing on a computer memory controller circuit. In an embodiment, host computer system 130 sweeps, in response to the setting in the first pass, tRAS parameters within a time window limit for the each wordline as computer software executing on computer memory controller circuit 136. For example, the tRAS parameters could depend on the architecture of computer memory circuit 140. Specifically, the tRAS parameters could be obtained from the data sheet(s) of computer memory circuit 140. For example, the time window limit could depend on the architecture of computer memory circuit 140. Specifically, the time window limit could be obtained from the data sheet(s) of computer memory circuit 140.

In an embodiment, host computer system 130 is configured to mark, in response to the sweeping in the first pass, row address data for cells of the each wordline having at least one reliability issue in the first pass in REM computer storage device 134. In an embodiment, host computer system 130 includes a computer system, such as computer system 400 as shown in FIG. 4, performing operation 214. In an embodiment, host computer system 130 includes a computer system, such as computer system/server 412 as shown in FIG. 4, performing operation 214. In an embodiment, host computer system 130 includes a computer system, such as processing unit 416 as shown in FIG. 4, performing operation 214. In an embodiment, host computer system 130 is a computer memory controller circuit performing operation 214. In an embodiment, host computer system 130 is computer memory controller circuit 136 performing operation 214. In an embodiment, host computer system 130 is implemented as computer software executing on a computer system, such as computer system 400 as shown in FIG. 4, such that the computer system performs operation 214. In an embodiment, host computer system 130 is implemented as computer software executing on a computer system, such as computer system/server 412 as shown in FIG. 4, such that the computer system performs operation 214. In an embodiment, host computer system 130 is implemented as computer software executing on a computer system, such as processing unit 416 as shown in FIG. 4 such that the computer system performs operation 214. In an embodiment, host computer system 130 is implemented as computer software executing on a computer system, such as a computer memory controller circuit, such that the computer system performs operation 214. In an embodiment, host computer system 130 is implemented as computer software executing on a computer system, such as computer memory controller circuit 136, such that the computer system performs operation 214. In an embodiment, host computer system 130 marks, in response to the sweeping in the first pass, row address data for cells of the each wordline having at least one reliability issue in the first pass in REM computer storage device 134 as computer software executing on a processor of host computer system 130. In an embodiment, host computer system 130 marks, in response to the sweeping in the first pass, row address data for cells of the each wordline having at least one reliability issue in the first pass in REM computer storage device 134 as computer software executing on a computer memory controller circuit. In an embodiment, host computer system 130 marks, in response to the sweeping in the first pass, row address data for cells of the each wordline having at least one reliability issue in the first pass in REM computer storage device 134 as computer software executing on computer memory controller circuit 136. For example, the at least one reliability issue could be cross talk.

In an embodiment, host computer system 130 is configured to set, in a second pass of the executing, the cell levels in the each wordline to a second value. In an embodiment, host computer system 130 includes a computer system, such as computer system 400 as shown in FIG. 4, performing operation 216. In an embodiment, host computer system 130 includes a computer system, such as computer system/server 412 as shown in FIG. 4, performing operation 216. In an embodiment, host computer system 130 includes a computer system, such as processing unit 416 as shown in FIG. 4, performing operation 216. In an embodiment, host computer system 130 is a computer memory controller circuit performing operation 216. In an embodiment, host computer system 130 is computer memory controller circuit 136 performing operation 216. In an embodiment, host computer system 130 is implemented as computer software executing on a computer system, such as computer system 400 as shown in FIG. 4, such that the computer system performs operation 216. In an embodiment, host computer system 130 is implemented as computer software executing on a computer system, such as computer system/server 412 as shown in FIG. 4, such that the computer system performs operation 216. In an embodiment, host computer system 130 is implemented as computer software executing on a computer system, such as processing unit 416 as shown in FIG. 4 such that the computer system performs operation 216. In an embodiment, host computer system 130 is implemented as computer software executing on a computer system, such as a computer memory controller circuit, such that the computer system performs operation 216. In an embodiment, host computer system 130 is implemented as computer software executing on a computer system, such as computer memory controller circuit 136, such that the computer system performs operation 216. In an embodiment, host computer system 130 sets, in a second pass of the executing, the cell levels in the each wordline to a second value as computer software executing on a processor of host computer system 136. In an embodiment, host computer system 130 sets, in a second pass of the executing, the cell levels in the each wordline to a second value as computer software executing on a computer memory controller circuit. In an embodiment, host computer system 130 sets, in a second pass of the executing, the cell levels in the each wordline to a second value as computer software executing on computer memory controller circuit 136. In a particular embodiment, the second value is a digital logic zero (0). In an alternative embodiment, the second value is a digital logic one (1). In a particular embodiment, the first value is a digital logic one (1), and the second value is a digital logic zero (0). In an alternative embodiment, the first value is a digital logic zero (0), and the second value is a digital logic one (1).

In an embodiment, host computer system 130 is configured to sweep, in response to the setting in the second pass, the tRAS parameters within the time window limit for the each wordline. In an embodiment, host computer system 130 includes a computer system, such as computer system 400 as shown in FIG. 4, performing operation 218. In an embodiment, host computer system 130 includes a computer system, such as computer system/server 412 as shown in FIG. 4, performing operation 218. In an embodiment, host computer system 130 includes a computer system, such as processing unit 416 as shown in FIG. 4, performing operation 218. In an embodiment, host computer system 130 is a computer memory controller circuit performing operation 218. In an embodiment, host computer system 130 is computer memory controller circuit 136 performing operation 218. In an embodiment, host computer system 130 is implemented as computer software executing on a computer system, such as computer system 400 as shown in FIG. 4, such that the computer system performs operation 218. In an embodiment, host computer system 130 is implemented as computer software executing on a computer system, such as computer system/server 412 as shown in FIG. 4, such that the computer system performs operation 218. In an embodiment, host computer system 130 is implemented as computer software executing on a computer system, such as processing unit 416 as shown in FIG. 4 such that the computer system performs operation 218. In an embodiment, host computer system 130 is implemented as computer software executing on a computer system, such as a computer memory controller circuit, such that the computer system performs operation 218. In an embodiment, host computer system 130 is implemented as computer software executing on a computer system, such as computer memory controller circuit 136, such that the computer system performs operation 218. In an embodiment, host computer system 130 sweeps, in response to the setting in the second pass, the tRAS parameters within the time window limit for the each wordline as computer software executing on a processor of host computer system 136. In an embodiment, host computer system 130 sweeps, in response to the setting in the second pass, the tRAS parameters within the time window limit for the each wordline as computer software executing on a computer memory controller circuit. In an embodiment, host computer system 130 sweeps, in response to the setting in the second pass, the tRAS parameters within the time window limit for the each wordline as computer software executing on computer memory controller circuit 136.

In an embodiment, host computer system 130 is configured to mark, in response to the sweeping in the second pass, row address data for cells of the each wordline having at least one reliability issue in the second pass in REM computer storage device 134. In an embodiment, host computer system 130 includes a computer system, such as computer system 400 as shown in FIG. 4, performing operation 220. In an embodiment, host computer system 130 includes a computer system, such as computer system/server 412 as shown in FIG. 4, performing operation 220. In an embodiment, host computer system 130 includes a computer system, such as processing unit 416 as shown in FIG. 4, performing operation 220. In an embodiment, host computer system 130 is a computer memory controller circuit performing operation 220. In an embodiment, host computer system 130 is computer memory controller circuit 136 performing operation 220. In an embodiment, host computer system 130 is implemented as computer software executing on a computer system, such as computer system 400 as shown in FIG. 4, such that the computer system performs operation 220. In an embodiment, host computer system 130 is implemented as computer software executing on a computer system, such as computer system/server 412 as shown in FIG. 4, such that the computer system performs operation 220. In an embodiment, host computer system 130 is implemented as computer software executing on a computer system, such as processing unit 416 as shown in FIG. 4 such that the computer system performs operation 220. In an embodiment, host computer system 130 is implemented as computer software executing on a computer system, such as a computer memory controller circuit, such that the computer system performs operation 220. In an embodiment, host computer system 130 is implemented as computer software executing on a computer system, such as computer memory controller circuit 136, such that the computer system performs operation 220. In an embodiment, host computer system 130 marks, in response to the sweeping in the second pass, row address data for cells of the each wordline having at least one reliability issue in the second pass in REM computer storage device 134 as computer software executing on a processor of host computer system 136. In an embodiment, host computer system 130 marks, in response to the sweeping in the second pass, row address data for cells of the each wordline having at least one reliability issue in the second pass in REM computer storage device 134 as computer software executing on a computer memory controller circuit. In an embodiment, host computer system 130 marks, in response to the sweeping in the second pass, row address data for cells of the each wordline having at least one reliability issue in the second pass in REM computer storage device 134 as computer software executing on computer memory controller circuit 136.

In an embodiment, computer memory controller circuit 136 executes an assessing in-field reliability of computer memories script or computer software application that carries out the operations of at least method 200. In an embodiment, computer memory controller circuit 136 executes an assessing in-field reliability of computer memories script or computer software application that carries out at least operations 210, 212, 214, 216, 218, and 220.

In an embodiment, computer memory controller circuit 136 is configured to set, in a first pass of the executing, cell levels in the each wordline to a first value. In an embodiment, computer memory controller circuit 136 performs operation 210. In an embodiment, computer memory controller circuit 136 sets, in a first pass of the executing, cell levels in the each wordline to a first value as computer software executing on computer memory controller circuit 136. In a particular embodiment, the first value is a digital logic one (1). In an alternative embodiment, the first value is a digital logic zero (0).

In an embodiment, computer memory controller circuit 136 is configured to sweep, in response to the setting in the first pass, tRAS parameters within a time window limit for the each wordline. In an embodiment, computer memory controller circuit 136 performs operation 212. In an embodiment, computer memory controller circuit 136 sweeps, in response to the setting in the first pass, tRAS parameters within a time window limit for the each wordline as computer software executing on computer memory controller circuit 136. For example, the tRAS parameters could depend on the architecture of computer memory circuit 140. Specifically, the tRAS parameters could be obtained from the data sheet(s) of computer memory circuit 140. For example, the time window limit could depend on the architecture of computer memory circuit 140. Specifically, the time window limit could be obtained from the data sheet(s) of computer memory circuit 140.

In an embodiment, computer memory controller circuit 136 is configured to mark, in response to the sweeping in the first pass, row address data for cells of the each wordline having at least one reliability issue in the first pass in REM computer storage device 134. In an embodiment, computer memory controller circuit 136 performs operation 214. In an embodiment, computer memory controller circuit 136 marks, in response to the sweeping in the first pass, row address data for cells of the each wordline having at least one reliability issue in the first pass in REM computer storage device 134 as computer software executing on computer memory controller circuit 136. For example, the at least one reliability issue could be cross talk.

In an embodiment, computer memory controller circuit 136 is configured to set, in a second pass of the executing, the cell levels in the each wordline to a second value. In an embodiment, computer memory controller circuit 136 performs operation 216. In an embodiment, computer memory controller circuit 136 sets, in a second pass of the executing, the cell levels in the each wordline to a second value as computer software executing on computer memory controller circuit 136. In a particular embodiment, the second value is a digital logic zero (0). In an alternative embodiment, the second value is a digital logic one (1). In a particular embodiment, the first value is a digital logic one (1), and the second value is a digital logic zero (0). In an alternative embodiment, the first value is a digital logic zero (0), and the second value is a digital logic one (1).

In an embodiment, computer memory controller circuit 136 is configured to sweep, in response to the setting in the second pass, the tRAS parameters within the time window limit for the each wordline. In an embodiment, computer memory controller circuit 136 performs operation 218. In an embodiment, computer memory controller circuit 136 sweeps, in response to the setting in the second pass, the tRAS parameters within the time window limit for the each wordline as computer software executing on computer memory controller circuit 136.

In an embodiment, computer memory controller circuit 136 is configured to mark, in response to the sweeping in the second pass, row address data for cells of the each wordline having at least one reliability issue in the second pass in REM computer storage device 134. In an embodiment, computer memory controller circuit 136 performs operation 220. In an embodiment, computer memory controller circuit 136 marks, in response to the sweeping in the second pass, row address data for cells of the each wordline having at least one reliability issue in the second pass in REM computer storage device 134 as computer software executing on computer memory controller circuit 136.

Hammering Cells

In a further embodiment, the executing further includes hammering each cell in the each wordline for a certain number of times. In an embodiment, host computer system 130 is configured to hammer each cell in the each wordline for a certain number of times. In an embodiment, host computer system 130 includes a computer system, such as computer system 400 as shown in FIG. 4, hammering each cell in the each wordline for a certain number of times. In an embodiment, host computer system 130 includes a computer system, such as computer system/server 412 as shown in FIG. 4, hammering each cell in the each wordline for a certain number of times. In an embodiment, host computer system 130 includes a computer system, such as processing unit 416 as shown in FIG. 4, hammering each cell in the each wordline for a certain number of times. In an embodiment, host computer system 130 includes a computer system, such as a computer memory controller circuit, hammering each cell in the each wordline for a certain number of times. In an embodiment, host computer system 130 includes a computer system, such as computer memory controller circuit 136, hammering each cell in the each wordline for a certain number of times. For example, the certain number of times could range from hundreds of times to hundreds of thousands of times. In another example, the certain number of times could range from hundreds of times to millions of times.

In an embodiment, host computer system 130 is implemented as computer software executing on a computer system, such as computer system 400 as shown in FIG. 4, such that the computer system hammers each cell in the each wordline for a certain number of times. In an embodiment, host computer system 130 is implemented as computer software executing on a computer system, such as computer system/server 412 as shown in FIG. 4, such that the computer system hammers each cell in the each wordline for a certain number of times. In an embodiment, host computer system 130 is implemented as computer software executing on a computer system, such as processing unit 416 as shown in FIG. 4, such that the computer system hammers each cell in the each wordline for a certain number of times. In an embodiment, host computer system 130 is implemented as computer software executing on a computer system, such as a computer memory controller circuit, such that the computer system hammers each cell in the each wordline for a certain number of times. In an embodiment, host computer system 130 is implemented as computer software executing on a computer system, such as computer memory controller circuit 136, such that the computer system hammers each cell in the each wordline for a certain number of times. In an embodiment, host computer system 130 hammers each cell in the each wordline for a certain number of times as computer software executing on a processor of host computer system 130. In an embodiment, host computer system 130 hammers each cell in the each wordline for a certain number of times as computer software executing on a computer memory controller circuit. In an embodiment, host computer system 130 hammers each cell in the each wordline for a certain number of times as computer software executing on a computer memory controller circuit 136.

In a particular embodiment, the hammering includes loading a pattern on cells adjacent to each cell in the each wordline for a certain number of times. In an embodiment, host computer system 130 is configured to load a pattern on cells adjacent to each cell in the each wordline for a certain number of times. In an embodiment, host computer system 130 includes a computer system, such as computer system 400 as shown in FIG. 4, loading a pattern on cells adjacent to each cell in the each wordline for a certain number of times. In an embodiment, host computer system 130 includes a computer system, such as computer system/server 412 as shown in FIG. 4, loading a pattern on cells adjacent to each cell in the each wordline for a certain number of times. In an embodiment, host computer system 130 includes a computer system, such as processing unit 416 as shown in FIG. 4, loading a pattern on cells adjacent to each cell in the each wordline for a certain number of times. In an embodiment, host computer system 130 includes a computer system, such as a computer memory controller circuit, loading a pattern on cells adjacent to each cell in the each wordline for a certain number of times. In an embodiment, host computer system 130 includes a computer system, such as computer memory controller circuit 136, loading a pattern on cells adjacent to each cell in the each wordline for a certain number of times. In a particular embodiment, the pattern includes a set of values selected from the group consisting of the first value and the second value. In a specific embodiment, the pattern is a set of values selected from the group consisting of the first value and the second value. For example, the pattern could be a set of the first values. In another example, the pattern could be a set of the second values. In another example, the pattern could be a combination of the first values and the second values. For example, the set of values of the pattern could correspond to/depend on the architecture of computer memory circuit 140. In other words, the set of values of the pattern could correspond to values that could induce a reliability issue in the cells. In an embodiment, the pattern is received from a user.

In an embodiment, host computer system 130 is implemented as computer software executing on a computer system, such as computer system 400 as shown in FIG. 4, such that the computer system loads a pattern on cells adjacent to each cell in the each wordline for a certain number of times. In an embodiment, host computer system 130 is implemented as computer software executing on a computer system, such as computer system/server 412 as shown in FIG. 4, such that the computer system loads a pattern on cells adjacent to each cell in the each wordline for a certain number of times. In an embodiment, host computer system 130 is implemented as computer software executing on a computer system, such as processing unit 416 as shown in FIG. 4, such that the computer system loads a pattern on cells adjacent to each cell in the each wordline for a certain number of times. In an embodiment, host computer system 130 is implemented as computer software executing on a computer system, such as a computer memory controller circuit, such that the computer system loads a pattern on cells adjacent to each cell in the each wordline for a certain number of times. In an embodiment, host computer system 130 is implemented as computer software executing on a computer system, such as computer memory controller circuit 136, such that the computer system loads a pattern on cells adjacent to each cell in the each wordline for a certain number of times. In an embodiment, host computer system 130 loads a pattern on cells adjacent to each cell in the each wordline for a certain number of times as computer software executing on a processor of host computer system 130. In an embodiment, host computer system 130 loads a pattern on cells adjacent to each cell in the each wordline for a certain number of times as computer software executing on a computer memory controller circuit. In an embodiment, host computer system 130 loads a pattern on cells adjacent to each cell in the each wordline for a certain number of times as computer software executing on a computer memory controller circuit 136.

In an embodiment, if the hammering results in cells being exposed to early failure, host computer system 130 performs array repair on the cells, thereby recovering the cells exposed to early failure. In another embodiment, if the hammering results in a number of failures experienced by the cells that exceeds a threshold, host computer system 130 spreads the hammering across computer memory circuit 140 to cover multiple DIMMs, thereby identifying systemic failures experienced by computer memory circuit 140.

In an embodiment, computer memory controller circuit 136 is configured to hammer each cell in the each wordline for a certain number of times. In an embodiment, computer memory controller circuit 136 hammers each cell in the each wordline for a certain number of times. For example, the certain number of times could range from hundreds of times to hundreds of thousands of times. In another example, the certain number of times could range from hundreds of times to millions of times. In an embodiment, computer memory controller circuit 136 hammers each cell in the each wordline for a certain number of times as computer software executing on computer memory controller circuit 136.

In a particular embodiment, the hammering includes loading a pattern on cells adjacent to each cell in the each wordline for a certain number of times. In an embodiment, computer memory controller circuit 136 is configured to load a pattern on cells adjacent to each cell in the each wordline for a certain number of times. In an embodiment, computer memory controller circuit 136 loads a pattern on cells adjacent to each cell in the each wordline for a certain number of times. In a particular embodiment, the pattern includes a set of values selected from the group consisting of the first value and the second value. In a specific embodiment, the pattern is a set of values selected from the group consisting of the first value and the second value. For example, the pattern could be a set of the first values. In another example, the pattern could be a set of the second values. In another example, the pattern could be a combination of the first values and the second values. For example, the set of values of the pattern could correspond to/depend on the architecture of computer memory circuit 140. In other words, the set of values of the pattern could correspond to values that could induce a reliability issue in the cells. In an embodiment, the pattern is received from a user. In an embodiment, computer memory controller circuit 136 loads a pattern on cells adjacent to each cell as computer software executing on computer memory controller circuit 136.

Assessing Reliability of Each Memory Subsystem

In a further embodiment, the computer implemented method, the system, and the computer program product further include performing the taking control, the utilizing, the moving, the executing, and the transmitting for each memory subsystem of a target computer system. In an embodiment, host computer system 130 is configured to perform taking control operation 110, utilizing operation 112, moving operation 114, executing operation 116, transmitting operation 118, and moving operation 120 for each memory subsystem of a target computer system. In an embodiment, host computer system 130 includes a computer system, such as computer system 400 as shown in FIG. 4, performing taking control operation 110, utilizing operation 112, moving operation 114, executing operation 116, transmitting operation 118, and moving operation 120 for each memory subsystem of a target computer system. In an embodiment, host computer system 130 includes a computer system, such as computer system/server 412 as shown in FIG. 4, performing taking control operation 110, utilizing operation 112, moving operation 114, executing operation 116, transmitting operation 118, and moving operation 120 for each memory subsystem of a target computer system. In an embodiment, host computer system 130 includes a computer system, such as processing unit 416 as shown in FIG. 4, performing taking control operation 110, utilizing operation 112, moving operation 114, executing operation 116, transmitting operation 118, and moving operation 120 for each memory subsystem of a target computer system. In an embodiment, host computer system 130 includes a computer system, such as a computer memory controller circuit, performing taking control operation 110, utilizing operation 112, moving operation 114, executing operation 116, transmitting operation 118, and moving operation 120 for each memory subsystem of a target computer system. In an embodiment, host computer system 130 includes a computer system, such as computer memory controller circuit 136, performing taking control operation 110, utilizing operation 112, moving operation 114, executing operation 116, transmitting operation 118, and moving operation 120 for each memory subsystem of a target computer system.

In an embodiment, host computer system 130 is implemented as computer software executing on a computer system, such as computer system 400 as shown in FIG. 4, such that the computer system performs taking control operation 110, utilizing operation 112, moving operation 114, executing operation 116, transmitting operation 118, and moving operation 120 for each memory subsystem of a target computer system. In an embodiment, host computer system 130 is implemented as computer software executing on a computer system, such as computer system/server 412 as shown in FIG. 4, such that the computer system performs taking control operation 110, utilizing operation 112, moving operation 114, executing operation 116, transmitting operation 118, and moving operation 120 for each memory subsystem of a target computer system. In an embodiment, host computer system 130 is implemented as computer software executing on a computer system, such as processing unit 416 as shown in FIG. 4, such that the computer system performs taking control operation 110, utilizing operation 112, moving operation 114, executing operation 116, transmitting operation 118, and moving operation 120 for each memory subsystem of a target computer system. In an embodiment, host computer system 130 is implemented as computer software executing on a computer system, such as a computer memory controller circuit, such that the computer system performs taking control operation 110, utilizing operation 112, moving operation 114, executing operation 116, transmitting operation 118, and moving operation 120 for each memory subsystem of a target computer system. In an embodiment, host computer system 130 is implemented as computer software executing on a computer system, such as computer memory controller circuit 136, such that the computer system performs taking control operation 110, utilizing operation 112, moving operation 114, executing operation 116, transmitting operation 118, and moving operation 120 for each memory subsystem of a target computer system. In an embodiment, host computer system 130 performs taking control operation 110, utilizing operation 112, moving operation 114, executing operation 116, transmitting operation 118, and moving operation 120 for each memory subsystem of a target computer system as computer software executing on a processor of host computer system 130. In an embodiment, host computer system 130 performs taking control operation 110, utilizing operation 112, moving operation 114, executing operation 116, transmitting operation 118, and moving operation 120 for each memory subsystem of a target computer system as computer software executing on a computer memory controller circuit. In an embodiment, host computer system performs taking control operation 110, utilizing operation 112, moving operation 114, executing operation 116, transmitting operation 118, and moving operation 120 for each memory subsystem of a target computer system as computer software executing on a computer memory controller circuit 136.

In an embodiment, computer memory controller circuit 136 is configured to perform taking control operation 110, utilizing operation 112, moving operation 114, executing operation 116, transmitting operation 118, and moving operation 120 for each memory subsystem of a target computer system. In an embodiment, computer memory controller circuit 136 performs taking control operation 110, utilizing operation 112, moving operation 114, executing operation 116, transmitting operation 118, and moving operation 120 for each memory subsystem of a target computer system. In an embodiment, computer memory controller circuit 136 performs taking control operation 110, utilizing operation 112, moving operation 114, executing operation 116, transmitting operation 118, and moving operation 120 for each memory subsystem of a target computer system as computer software executing on computer memory controller circuit 136.

In a further embodiment, the computer implemented method, the system, and the computer program product further include performing the taking control, the utilizing, the moving, and the executing, for each memory subsystem of a target computer system. In an embodiment, computer memory controller circuit 136 is configured to perform taking control operation 152, utilizing operation 154, moving operation 156, executing operation 158, and moving operation 160 for each memory subsystem of a target computer system. In an embodiment, computer memory controller circuit 136 performs taking control operation 152, utilizing operation 154, moving operation 156, executing operation 158, and moving operation 160 for each memory subsystem of a target computer system. In an embodiment, computer memory controller circuit 136 performs taking control operation 152, utilizing operation 154, moving operation 156, executing operation 158, and moving operation 160 for each memory subsystem of a target computer system as computer software executing on computer memory controller circuit 136.

Periodic Assessment

In a particular embodiment, the performing includes performing the taking control, the utilizing, the moving, the executing, and the transmitting on a periodic basis. In an embodiment, host computer system 130 is configured to perform taking control operation 110, utilizing operation 112, moving operation 114, executing operation 116, transmitting operation 118, and moving operation 120 for each memory subsystem of a target computer system on a periodic basis. In an embodiment, host computer system 130 includes a computer system, such as computer system 400 as shown in FIG. 4, performing taking control operation 110, utilizing operation 112, moving operation 114, executing operation 116, transmitting operation 118, and moving operation 120 for each memory subsystem of a target computer system on a periodic basis. In an embodiment, host computer system 130 includes a computer system, such as computer system/server 412 as shown in FIG. 4, performing taking control operation 110, utilizing operation 112, moving operation 114, executing operation 116, transmitting operation 118, and moving operation 120 for each memory subsystem of a target computer system on a periodic basis. In an embodiment, host computer system 130 includes a computer system, such as processing unit 416 as shown in FIG. 4, performing taking control operation 110, utilizing operation 112, moving operation 114, executing operation 116, transmitting operation 118, and moving operation 120 for each memory subsystem of a target computer system on a periodic basis. In an embodiment, host computer system 130 includes a computer system, such as a computer memory controller circuit, performing taking control operation 110, utilizing operation 112, moving operation 114, executing operation 116, transmitting operation 118, and moving operation 120 for each memory subsystem of a target computer system on a periodic basis. In an embodiment, host computer system 130 includes a computer system, such as computer memory controller circuit 136, performing taking control operation 110, utilizing operation 112, moving operation 114, executing operation 116, transmitting operation 118, and moving operation 120 for each memory subsystem of a target computer system on a periodic basis.

In an embodiment, host computer system 130 is implemented as computer software executing on a computer system, such as computer system 400 as shown in FIG. 4, such that the computer system performs taking control operation 110, utilizing operation 112, moving operation 114, executing operation 116, transmitting operation 118, and moving operation 120 for each memory subsystem of a target computer system on a periodic basis. In an embodiment, host computer system 130 is implemented as computer software executing on a computer system, such as computer system/server 412 as shown in FIG. 4, such that the computer system performs taking control operation 110, utilizing operation 112, moving operation 114, executing operation 116, transmitting operation 118, and moving operation 120 for each memory subsystem of a target computer system on a periodic basis. In an embodiment, host computer system 130 is implemented as computer software executing on a computer system, such as processing unit 416 as shown in FIG. 4, such that the computer system performs taking control operation 110, utilizing operation 112, moving operation 114, executing operation 116, transmitting operation 118, and moving operation 120 for each memory subsystem of a target computer system on a periodic basis. In an embodiment, host computer system 130 is implemented as computer software executing on a computer system, such as a computer memory controller circuit, such that the computer system performs taking control operation 110, utilizing operation 112, moving operation 114, executing operation 116, transmitting operation 118, and moving operation 120 for each memory subsystem of a target computer system on a periodic basis. In an embodiment, host computer system 130 is implemented as computer software executing on a computer system, such as computer memory controller circuit 136, such that the computer system performs taking control operation 110, utilizing operation 112, moving operation 114, executing operation 116, transmitting operation 118, and moving operation 120 for each memory subsystem of a target computer system on a periodic basis. In an embodiment, host computer system 130 performs taking control operation 110, utilizing operation 112, moving operation 114, executing operation 116, transmitting operation 118, and moving operation 120 for each memory subsystem of a target computer system on a periodic basis as computer software executing on a processor of host computer system 130. In an embodiment, host computer system 130 performs taking control operation 110, utilizing operation 112, moving operation 114, executing operation 116, transmitting operation 118, and moving operation 120 for each memory subsystem of a target computer system on a periodic basis as computer software executing on a computer memory controller circuit. In an embodiment, host computer system performs taking control operation 110, utilizing operation 112, moving operation 114, executing operation 116, transmitting operation 118, and moving operation 120 for each memory subsystem of a target computer system on a periodic basis as computer software executing on a computer memory controller circuit 136.

In an embodiment, computer memory controller circuit 136 is configured to perform taking control operation 110, utilizing operation 112, moving operation 114, executing operation 116, transmitting operation 118, and moving operation 120 for each memory subsystem of a target computer system on a periodic basis. In an embodiment, computer memory controller circuit 136 performs taking control operation 110, utilizing operation 112, moving operation 114, executing operation 116, transmitting operation 118, and moving operation 120 for each memory subsystem of a target computer system on a periodic basis. In an embodiment, computer memory controller circuit 136 performs taking control operation 110, utilizing operation 112, moving operation 114, executing operation 116, transmitting operation 118, and moving operation 120 for each memory subsystem of a target computer system on a periodic basis as computer software executing on computer memory controller circuit 136.

In a particular embodiment, the performing includes performing the taking control, the utilizing, the moving, and the executing, on a periodic basis. In an embodiment, computer memory controller circuit 136 is configured to perform taking control operation 152 utilizing operation 154, moving operation 156, executing operation 158, and moving operation 160 for each memory subsystem of a target computer system on a periodic basis. In an embodiment, computer memory controller circuit 136 performs taking control operation 152, utilizing operation 154, moving operation 156, executing operation 158, and moving operation 160 for each memory subsystem of a target computer system on a periodic basis. In an embodiment, computer memory controller circuit 136 performs taking control operation 152, utilizing operation 154, moving operation 156, executing operation 158, and moving operation 160 for each memory subsystem of a target computer system on a periodic basis as computer software executing computer memory controller circuit 136.

Assessing Reliability Based on Learning

In a further embodiment, the computer implemented method, the system, and the computer program product further include performing the taking control, the utilizing, the moving, the executing, and the transmitting in an adaptive manner based on learning. In an embodiment, host computer system 130 is configured to perform taking control operation 110, utilizing operation 112, moving operation 114, executing operation 116, transmitting operation 118, and moving operation 120 in an adaptive manner based on learning. In an embodiment, host computer system 130 includes a computer system, such as computer system 400 as shown in FIG. 4, performing taking control operation 110, utilizing operation 112, moving operation 114, executing operation 116, transmitting operation 118, and moving operation 120 in an adaptive manner based on learning. In an embodiment, host computer system 130 includes a computer system, such as computer system/server 412 as shown in FIG. 4, performing taking control operation 110, utilizing operation 112, moving operation 114, executing operation 116, transmitting operation 118, and moving operation 120 in an adaptive manner based on learning. In an embodiment, host computer system 130 includes a computer system, such as processing unit 416 as shown in FIG. 4, performing taking control operation 110, utilizing operation 112, moving operation 114, executing operation 116, transmitting operation 118, and moving operation 120 in an adaptive manner based on learning. In an embodiment, host computer system 130 includes a computer system, such as a computer memory controller circuit, performing taking control operation 110, utilizing operation 112, moving operation 114, executing operation 116, transmitting operation 118, and moving operation 120 in an adaptive manner based on learning. In an embodiment, host computer system 130 includes a computer system, such as computer memory controller circuit 136, performing taking control operation 110, utilizing operation 112, moving operation 114, executing operation 116, transmitting operation 118, and moving operation 120 in an adaptive manner based on learning.

In an embodiment, host computer system 130 is implemented as computer software executing on a computer system, such as computer system 400 as shown in FIG. 4, such that the computer system performs taking control operation 110, utilizing operation 112, moving operation 114, executing operation 116, transmitting operation 118, and moving operation 120 in an adaptive manner based on learning. In an embodiment, host computer system 130 is implemented as computer software executing on a computer system, such as computer system/server 412 as shown in FIG. 4, such that the computer system performs taking control operation 110, utilizing operation 112, moving operation 114, executing operation 116, transmitting operation 118, and moving operation 120 in an adaptive manner based on learning. In an embodiment, host computer system 130 is implemented as computer software executing on a computer system, such as processing unit 416 as shown in FIG. 4, such that the computer system performs taking control operation 110, utilizing operation 112, moving operation 114, executing operation 116, transmitting operation 118, and moving operation 120 in an adaptive manner based on learning. In an embodiment, host computer system 130 is implemented as computer software executing on a computer system, such as a computer memory controller circuit, such that the computer system performs taking control operation 110, utilizing operation 112, moving operation 114, executing operation 116, transmitting operation 118, and moving operation 120 in an adaptive manner based on learning. In an embodiment, host computer system 130 is implemented as computer software executing on a computer system, such as computer memory controller circuit 136, such that the computer system performs taking control operation 110, utilizing operation 112, moving operation 114, executing operation 116, transmitting operation 118, and moving operation 120 in an adaptive manner based on learning. In an embodiment, host computer system 130 performs taking control operation 110, utilizing operation 112, moving operation 114, executing operation 116, transmitting operation 118, and moving operation 120 in an adaptive manner based on learning as computer software executing on a processor of host computer system 130. In an embodiment, host computer system 130 performs taking control operation 110, utilizing operation 112, moving operation 114, executing operation 116, transmitting operation 118, and moving operation 120 in an adaptive manner based on learning as computer software executing on a computer memory controller circuit. In an embodiment, host computer system performs taking control operation 110, utilizing operation 112, moving operation 114, executing operation 116, transmitting operation 118, and moving operation 120 in an adaptive manner based on learning as computer software executing on a computer memory controller circuit 136.

In a particular embodiment, the learning is based on at least one error detected by an error correction code (ECC) decoder circuit logically coupled to the host computer system. In a specific embodiment, the at least one error is a symbol error or a multi-bit error. In an embodiment, host computer system 130 changes the frequency at which computer system 130 performs method 100 based on the at least one error. In a particular embodiment, host computer system 130 changes the frequency at which computer system 130 performs method 100 proportionally to an error rate detected by the ECC decoder circuit.

In an embodiment, computer memory controller circuit 136 is configured to perform taking control operation 110, utilizing operation 112, moving operation 114, executing operation 116, transmitting operation 118, and moving operation 120 in an adaptive manner based on learning. In an embodiment, computer memory controller circuit 136 performs taking control operation 110, utilizing operation 112, moving operation 114, executing operation 116, transmitting operation 118, and moving operation 120 in an adaptive manner based on learning. In an embodiment, computer memory controller circuit 136 performs taking control operation 110, utilizing operation 112, moving operation 114, executing operation 116, transmitting operation 118, and moving operation 120 in an adaptive manner based on learning as computer software executing on computer memory controller circuit 136.

In a particular embodiment, the learning is based on at least one error detected by an error correction code (ECC) decoder circuit logically coupled to the computer memory controller circuit 136. In a specific embodiment, the at least one error is a symbol error or a multi-bit error. In an embodiment, computer memory controller circuit 136 changes the frequency at which computer memory controller circuit 136 performs method 100 based on the at least one error. In a particular embodiment, computer memory controller circuit 136 changes the frequency at which computer memory controller circuit 136 performs method 100 proportionally to an error rate detected by the ECC decoder circuit.

In a further embodiment, the computer implemented method, the system, and the computer program product further include performing the taking control, the utilizing, the moving, and the executing in an adaptive manner based on learning. In an embodiment, computer memory controller circuit 136 is configured to perform taking control operation 152, utilizing operation 154, moving operation 156, executing operation 158, and moving operation 160 in an adaptive manner based on learning. In an embodiment, computer memory controller circuit 136 performs taking control operation 152, utilizing operation 154, moving operation 156, executing operation 158, and moving operation 160 in an adaptive manner based on learning. In an embodiment, computer memory controller circuit 136 performs taking control operation 152, utilizing operation 154, moving operation 156, executing operation 158, and moving operation 160 in an adaptive manner based on learning as computer software executing on computer memory controller circuit 136.

In a particular embodiment, the learning is based on at least one error detected by an error correction code (ECC) decoder circuit logically coupled to computer memory controller circuit 136. In a specific embodiment, the at least one error is a symbol error or a multi-bit error. In an embodiment, computer memory controller circuit 136 changes the frequency at which computer memory controller circuit 136 performs method 100 based on the at least one error. In a particular embodiment, computer memory controller circuit 136 changes the frequency at which computer memory controller circuit 136 performs method 100 proportionally to an error rate detected by the ECC decoder circuit.

Example

Figure 3:
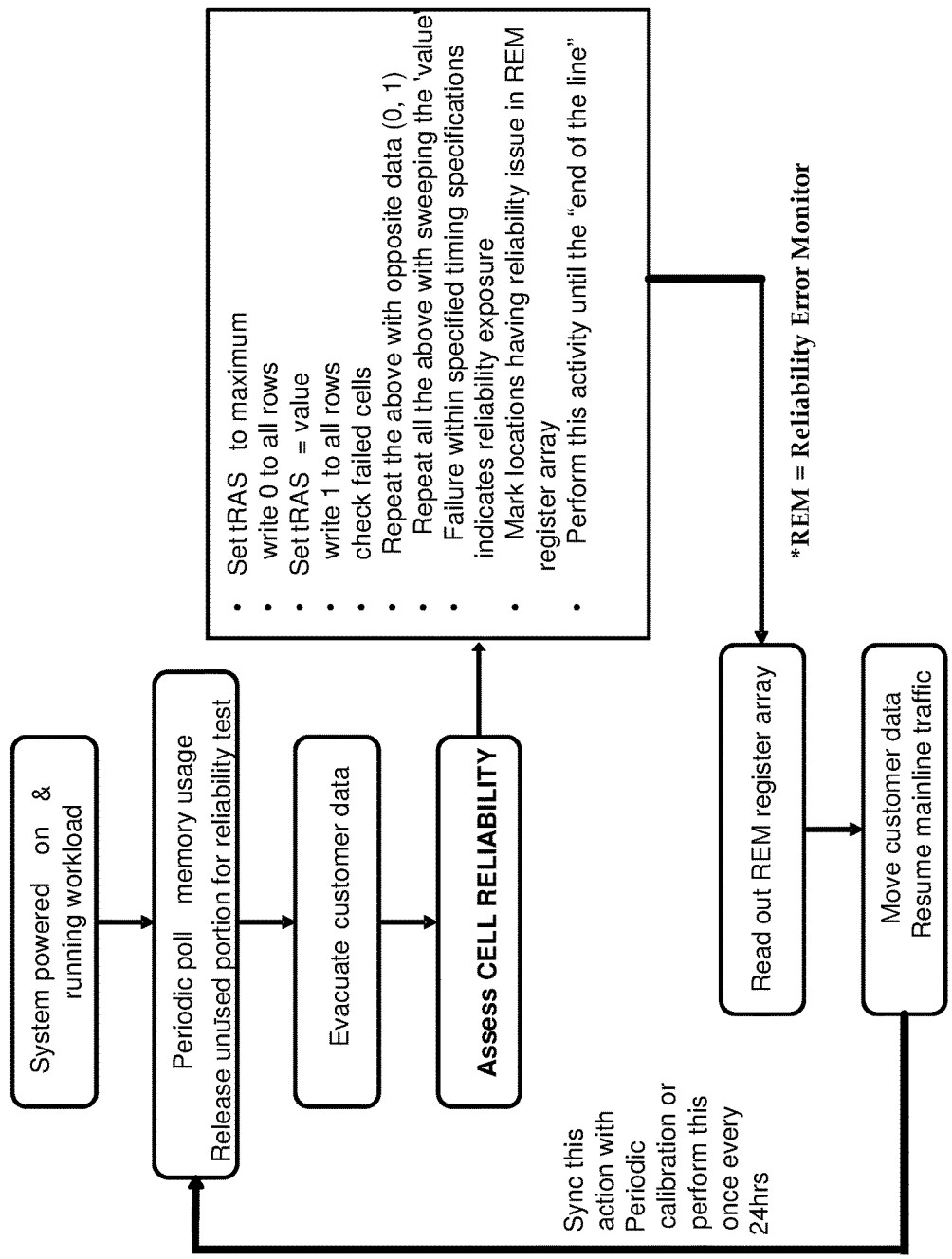
FIG. 3 depicts a flowchart in accordance with an exemplary embodiment of the present invention.

Referring to FIG. 3, for example, the present invention could assess the reliability of computer memory cells of a computer memory by (1) selecting a wordline in the memory and setting cell levels in the wordline to either 1 or 0, (2) sweeping tRAS parameters within window limit as per timing specifications and monitoring for failures, where a failure within specified timing specifications indicates reliability exposure, (3) marking the row address data having reliability issue in a "reliability error monitor (REM)" register array, and (4) repeating the selecting, the sweeping, and the marking for all wordlines of the memory array under assessment. Once the assessment is complete, the present invention could read out the REM register array to a memory controller to initiate suitable control actions (e.g., row repair or modify signal timing parameters. Afterwards, the present invention could move customer data back to the memory area and resume mainline operation. Notably, the present invention could be a periodical calibration scheme to scan through all memory subsystems of a computer system. In addition, for example, the present invention could assess cell reliability with respect to timing parameters. In a specific example, the present invention could adjust timing parameters on the go when performing in-field memory reliability testing/assessment.

In another example, the present invention could hammer of a memory cell for thousands of times, with a specific pattern loaded on adjacent cells in order to determine healthy state of the cell in light of "aggravated or stronger" adjacent cell interference, cross talk, leakage such that if the cell is exposed to early failure, then the present invention triggers array repair to recover affected cells. In a further example, if are many failures above a threshold is observed, the present invention could spread hammering across subsystems covering multiple DIMMs to identify systemic fails.

In a specific example, the present invention could start with fixed time based "array check calibration" (e.g., every 24 hours) and could makes the rate of calibration adaptive to what is seen in the field. For example, the present invention could base the rate of calibration on symbol or multi-bit error detected by an ECC decoder, such that the calibration frequency could increase/decrease dynamically. In another example, the present invention could make the calibration frequency increase proportionately to error rate and vice versa, where this would be applicable for error rate as detected by scrub cycles.

Computer System

In an exemplary embodiment, the host computer system is a computer system 400 as shown in FIG. 4. Computer system 400 is only one example of a computer system and is not intended to suggest any limitation as to the scope of use or functionality of embodiments of the present invention. Regardless, computer system 400 is capable of being implemented to perform and/or performing any of the functionality/operations of the present invention.

Computer system 400 includes a computer system/server 412, which is operational with numerous other general purpose or special purpose computing system environments or configurations. Examples of well-known computing systems, environments, and/or configurations that may be suitable for use with computer system/server 412 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer system/server 412 may be described in the general context of computer system-executable instructions, such as program modules, being executed by a computer system. Generally, program modules may include routines, programs, objects, components, logic, and/or data structures that perform particular tasks or implement particular abstract data types. Computer system/server 412 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 4, computer system/server 412 in computer system 400 is shown in the form of a general-purpose computing device. The components of computer system/server 412 may include, but are not limited to, one or more processors or processing units 416, a system memory 428, and a bus 418 that couples various system components including system memory 428 to processor 416.

Bus 418 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 412 typically includes a variety of computer system readable media. Such media may be any available media that is accessible by computer system/server 412, and includes both volatile and non-volatile media, removable and non-removable media.

System memory 428 can include computer system readable media in the form of volatile memory, such as random access memory (RAM) 430 and/or cache memory 432. Computer system/server 412 may further include other removable/non-removable, volatile/non-volatile computer system storage media. By way of example only, storage system 434 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 418 by one or more data media interfaces. As will be further depicted and described below, memory 428 may include at least one program product having a set (e.g., at least one) of program modules that are configured to carry out the functions/operations of embodiments of the invention.

Program/utility 440, having a set (at least one) of program modules 442, may be stored in memory 428 by way of example, and not limitation. Exemplary program modules 442 may include an operating system, one or more application programs, other program modules, and program data.

Each of the operating system, one or more application programs, other program modules, and program data or some combination thereof, may include an implementation of a networking environment. Program modules 442 generally carry out the functions and/or methodologies of embodiments of the present invention.

Computer system/server 412 may also communicate with one or more external devices 414 such as a keyboard, a pointing device, a display 424, one or more devices that enable a user to interact with computer system/server 412, and/or any devices (e.g., network card, modem, etc.) that enable computer system/server 412 to communicate with one or more other computing devices. Such communication can occur via Input/Output (I/O) interfaces 422. Still yet, computer system/server 412 can communicate with one or more networks such as a local area network (LAN), a general wide area network (WAN), and/or a public network (e.g., the Internet) via network adapter 420. As depicted, network adapter 420 communicates with the other components of computer system/server 412 via bus 418. It should be understood that although not shown, other hardware and/or software components could be used in conjunction with computer system/server 412. Examples, include, but are not limited to: microcode, device drivers, redundant processing units, external disk drive arrays, RAID systems, tape drives, and data archival storage systems.

Computer Program Product

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer implemented method comprising:
    taking control, by a host computer system, of a portion of a computer memory circuit;
    utilizing, by the host computer system, a portion of a computer memory bus, wherein the portion of the computer memory bus is associated with the portion of the computer memory circuit;
    moving, by the host computer system, computer memory circuit data stored in the portion of the computer memory circuit to a host computer storage device;
    executing, by the host computer system, a set of logical operations assessing reliability of the portion of the computer memory circuit, resulting in assessment data stored in a reliability error monitor (REM) computer storage device;
    transmitting, by the host computer system, the stored assessment data from the REM computer storage device to a computer memory controller circuit; and
    in response to the transmitting, moving, by the host computer system, the moved computer memory circuit data from the host computer storage device back to the portion of the computer memory circuit.

2. The method of claim 1 wherein the host computer system comprises the computer memory controller circuit.

3. The method of claim 1 wherein the taking control comprises taking exclusive control of the portion of the computer memory circuit.

4. The method of claim 1 wherein the portion of the computer memory circuit comprises a set of memory cells of the computer memory circuit.

5. The method of claim 4 wherein the set of memory cells comprises at least one of an area of a memory array, a memory bank, a memory rank, and an area of a dual in-line memory module (DIMM) module.

6. The method of claim 1 wherein the executing comprises, for each wordline of the portion of the computer memory circuit:
- in a first pass of the executing, setting cell levels in the each wordline to a first value;
- in response to the setting in the first pass, sweeping row active time (tRAS) parameters within a time window limit for the each wordline;
- in response to the sweeping in the first pass, marking row address data for cells of the each wordline having at least one reliability issue in the first pass in the REM computer storage device;
- in a second pass of the executing, setting the cell levels in the each wordline to a second value;
- in response to the setting in the second pass, sweeping the tRAS parameters within the time window limit for the each wordline; and
- in response to the sweeping in the second pass, marking row address data for cells of the each wordline having at least one reliability issue in the second pass in the REM computer storage device.

7. The method of claim 6 further comprising hammering each cell in the each wordline for a certain number of times.

8. The method of claim 7 wherein the hammering comprises loading a pattern on cells adjacent to each cell in the each wordline for a certain number of times.

9. The method of claim 1 further comprising performing the taking control, the utilizing, the moving, the executing, and the transmitting for each memory subsystem of a target computer system.

10. The method of claim 9 wherein the performing comprises performing the taking control, the utilizing, the moving, the executing, and the transmitting on a periodic basis.

11. The method of claim 1 further comprising performing the taking control, the utilizing, the moving, the executing, and the transmitting in an adaptive manner based on learning.

12. The method of claim 11 wherein the learning is based on at least one error detected by an error correction code (ECC) decoder circuit logically coupled to the host computer system.

13. A system comprising a host computer system:
- to take control of a portion of a computer memory circuit,
- to utilize a portion of a computer memory bus, wherein the portion of the computer memory bus is associated with the portion of the computer memory circuit,
- to move computer memory circuit data stored in the portion of the computer memory circuit to a host computer storage device,
- to execute a set of logical operations assessing reliability of the portion of the computer memory circuit, resulting in assessment data stored in a reliability error monitor (REM) computer storage device,
- to transmit the stored assessment data from the REM computer storage device to a computer memory controller circuit, and
- to move, in response to the transmitting, the moved computer memory circuit data from the host computer storage device back to the portion of the computer memory circuit.

14. The system of claim 13 wherein the host computer system comprises the computer memory controller circuit.

15. The system of claim 13 wherein to take control, the host computer system takes exclusive control of the portion of the computer memory circuit.

16. The system of claim 13 wherein the portion of the computer memory circuit comprises a set of memory cells of the computer memory circuit.

17. The system of claim 13 wherein the set of memory cells comprises at least one of an area of a memory array, a memory bank, a memory rank, and an area of a dual in-line memory module (DIMM) module.

18. The system of claim 13 wherein to execute, the host computer system, for each wordline of the portion of the computer memory circuit,
- in a first pass of the executing, sets cell levels in the each wordline to a first value,
- in response to the setting in the first pass, sweeps row active time (tRAS) parameters within a time window limit for the each wordline,
- in response to the sweeping in the first pass, marks row address data for cells of the each wordline having at least one reliability issue in the first pass in the REM computer storage device,
- in a second pass of the executing, sets the cell levels in the each wordline to a second value,
- in response to the setting in the second pass, sweeps the tRAS parameters within the time window limit for the each wordline, and
- in response to the sweeping in the second pass, marks row address data for cells of the each wordline having at least one reliability issue in the second pass in the REM computer storage device.

19. A computer program product comprising a computer readable storage medium having program instructions embodied therewith, the program instructions executable by a processor to cause the processor to perform a method comprising:
- taking control, by a host computer system, of a portion of a computer memory circuit;
- utilizing, by the host computer system, a portion of a computer memory bus, wherein the portion of the computer memory bus is associated with the portion of the computer memory circuit;
- moving, by the host computer system, computer memory circuit data stored in the portion of the computer memory circuit to a host computer storage device;
- executing, by the host computer system, a set of logical operations assessing reliability of the portion of the computer memory circuit, resulting in assessment data stored in a reliability error monitor (REM) computer storage device;
- transmitting, by the host computer system, the stored assessment data from the REM computer storage device to a computer memory controller circuit; and
- in response to the transmitting, moving, by the host computer system, the moved computer memory circuit data from the host computer storage device back to the portion of the computer memory circuit.

20. The computer program product of claim 19 wherein the executing comprises, for each wordline of the portion of the computer memory circuit:
- in a first pass of the executing, setting cell levels in the each wordline to a first value;
- in response to the setting in the first pass, sweeping row active time (tRAS) parameters within a time window limit for the each wordline;
- in response to the sweeping in the first pass, marking row address data for cells of the each wordline having at least one reliability issue in the first pass in the REM computer storage device;

in a second pass of the executing, setting the cell levels in the each wordline to a second value;

in response to the setting in the second pass, sweeping the tRAS parameters within the time window limit for the each wordline; and in response to the sweeping in the second pass, marking row address data for cells of the each wordline having at least one reliability issue in the second pass in the REM computer storage device.

\* \* \* \* \*